US009177182B2

(12) United States Patent
Okuda

(10) Patent No.: US 9,177,182 B2
(45) Date of Patent: Nov. 3, 2015

(54) SEMICONDUCTOR DEVICE FOR WIRELESS COMMUNICATION

(75) Inventor: Yuichi Okuda, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 910 days.

(21) Appl. No.: 13/272,262

(22) Filed: Oct. 13, 2011

(65) Prior Publication Data

US 2012/0106219 A1 May 3, 2012

(30) Foreign Application Priority Data

Oct. 28, 2010 (JP) .................................. 2010-242257

(51) Int. Cl.
| | |
|---|---|
| G06K 7/10 | (2006.01) |
| G06K 19/07 | (2006.01) |
| H01L 27/02 | (2006.01) |
| H01L 27/088 | (2006.01) |
| H01L 27/092 | (2006.01) |

(52) U.S. Cl.
CPC ........ *G06K 7/10237* (2013.01); *G06K 19/0705* (2013.01); *G06K 19/0709* (2013.01); *H01L 27/0222* (2013.01); *H01L 27/088* (2013.01); *H01L 27/0928* (2013.01); *Y02B 60/50* (2013.01)

(58) Field of Classification Search
CPC ... G06K 19/00; G06K 19/07; G06K 19/0705; G06K 19/0723; G06K 19/0709; G06K 19/10237; G06K 19/0008; Y02B 60/50
USPC .................. 340/10.1, 572.1; 320/108; 455/91
See application file for complete search history.

(56) References Cited

U.S. PATENT DOCUMENTS

| | | | |
|---|---|---|---|
| 8,301,915 B2 | 10/2012 | Watanabe et al. | |
| 2004/0001453 A1 | 1/2004 | Kawai et al. | |
| 2005/0277241 A1* | 12/2005 | Watanabe et al. ............. | 438/200 |

(Continued)

FOREIGN PATENT DOCUMENTS

| | | |
|---|---|---|
| CN | 101714220 A | 5/2010 |
| EP | 1 026 832 A1 | 8/2000 |

(Continued)

OTHER PUBLICATIONS

European Search Report received in corresponding European Application No. 11184179 dated Oct. 21, 2014.

(Continued)

*Primary Examiner* — Jessica Han
*Assistant Examiner* — Gustavo Rosario Benitez
(74) *Attorney, Agent, or Firm* — Mattingly & Malur, PC

(57) ABSTRACT

Provided is a semiconductor device for wireless communication which achieves a reduction in leakage power and allows an improvement in power efficiency. For example, to external terminals, an antenna driver section for driving an antenna and a rectifying section for rectifying input power from the antenna are coupled. The antenna driver section includes pull-up PMOS transistors and pull-down NMOS transistors. In the rectifying section, a power supply voltage generated by a full-wave rectifying circuit is boosted by a voltage boosting circuit. For example, when a supply of a power supply voltage from a battery is stopped, a power supply voltage resulting from the boosting by the voltage boosting circuit is supplied to the bulk of each of the pull-up PMOS transistors.

17 Claims, 24 Drawing Sheets

(56) References Cited

U.S. PATENT DOCUMENTS

| | | | |
|---|---|---|---|
| 2006/0128345 A1* | 6/2006 | Ootaka et al. | 455/333 |
| 2007/0127185 A1* | 6/2007 | Watanabe | 361/143 |
| 2008/0315995 A1* | 12/2008 | Okuda | 340/10.1 |
| 2009/0160652 A1* | 6/2009 | Watanabe et al. | 340/572.1 |
| 2009/0184690 A1* | 7/2009 | Otaka et al. | 320/166 |
| 2010/0034000 A1 | 2/2010 | Battista et al. | |
| 2010/0079203 A1* | 4/2010 | Furutani | 327/564 |
| 2010/0088534 A1 | 4/2010 | Watanabe et al. | |
| 2010/0155851 A1* | 6/2010 | Koyama et al. | 257/369 |

FOREIGN PATENT DOCUMENTS

| | | |
|---|---|---|
| GB | 2 456 850 A | 7/2009 |
| JP | 5-298498 A | 11/1993 |
| JP | 2000-172806 A | 6/2000 |
| JP | 2004-151750 A | 5/2004 |

OTHER PUBLICATIONS

Chinese Office Action received in corresponding Chinese Application No. 201110332695.X dated May 5, 2015.

* cited by examiner

FIG. 9

|  | bless | txvcc | vccrect2 | vccnwell |
|---|---|---|---|---|
| DURING BATTERY-LESS MODE PERIOD | 2.7 V | 0 V | 5.0 V | 5.0 V |
| DURING ANOTHER MODE PERIOD | 0 V | 3.0 V | 0 V | 3.0 V |

FIG. 16

| txreg_off | bless | carr_on | OPAMP10 | pullup (MPpu) | pulldown (MNpd) |
|---|---|---|---|---|---|
| 0 | 0 | 0 | off | on | off |
| 0 | 0 | 1 | off | off | on |
| 0 | 1 | 0 | on | off | off |
| 0 | 1 | 1 | on | off | off |
| 1 | 0 | 0 | off | off | on |
| 1 | 0 | 1 | off | off | on |
| 1 | 1 | 0 | off | off | on |
| 1 | 1 | 1 | off | off | on |

FIG. 21

| | bless | swvccout_on | swvccin | swregout | vccrf | nwell_swppsw | swvccout |
|---|---|---|---|---|---|---|---|
| CLASS B | 0 | 0 | 3.0 | 1.8 | 3.0 | swvccin | 0.0 |
| | 0 | 1 | 3.0 | 1.8 | 3.0 | swvccin | swvccin |
| CLASS C | 0 | 0 | 1.8 | 0.0 | 3.0 | swvccin | 0.0 |
| | 0 | 1 | 1.8 | 0.0 | 3.0 | swvccin | swvccin |
| BLESS | 1 | 0 | 0.0 | 1.8 | 2.7 | swregout | 0.0 |
| | 1 | 1 | 0.0 | 1.8 | 2.7 | swregout | swregout |
| POWER OFF | 0 | 0 | 3.0 | 0.0 | 0.0 | swvccin | swvccin |
| | 0 | 0 | 1.8 | 0.0 | 0.0 | swvccin | swvccin |

SEMICONDUCTOR DEVICE FOR WIRELESS COMMUNICATION

CROSS-REFERENCE TO RELATED APPLICATIONS

The disclosure of Japanese Patent Application No. 2010-242257 filed on Oct. 28, 2010 including the specification, drawings and abstract is incorporated herein by reference in its entirety.

BACKGROUND

The present invention relates to a semiconductor device for wireless communication, and particularly to a technology which is effective when applied to a semiconductor device for wireless communication which implements an NFC (Near Field Communication) function in a mobile phone.

For example, in Patent Document 1, a non-contact IC card is shown in which a rectifying circuit, two demodulating circuits, and a modulating circuit are coupled in parallel to the both ends of an antenna coil. Also, in Patent Document 2, a non-contact data storage system is shown which can selectively couple a rectifying circuit and a signal reception node or a transmission node to an antenna coil.

RELATED ART DOCUMENTS

Patent Documents

[Patent Document 1]
Japanese Unexamined Patent Publication No. 2000-172806
[Patent Document 2]
Japanese Unexamined Patent Publication No. Hei 5 (1993)-298498

SUMMARY

In recent years, in various countries including Japan as a representative and also overseas countries, equipment of a mobile phone system with an NFC (Near Field Communication) function has been promoted. The NFC function embedded in a mobile phone system is performed in a card mode in which the mobile phone system operates as an IC card (UICC: Universal Integrated Circuit Card) and in a RW mode in which the mobile phone system operates as a reader/writer (RW). Wireless communication operations in the card mode and the RW mode are implemented by a semiconductor chip (called "NFC chip") for wireless communication embedded in the mobile phone system.

Since the IC card operates by receiving a power supply from a magnetic field outputted from the reader/writer RW, it is basically unnecessary to mount a battery or the like on the IC card. However, to the NFC chip embedded in the mobile phone system, an external power supply such as a battery is normally indispensable. For example, when the NFC chip operates in the RW mode, there is no magnetic field inputted from the outside so that the NFC chip needs to receive a power supply from an external power supply. When operating in the card mode also, the NFC chip needs to have multiple functions (the implementation of e.g., a Suica (registered trademark) card and an Edy (registered trademark) card), unlike a typical single-function IC card (e.g., the Suica (registered trademark) card). As a result, with an increase in power consumption, the power supply from the magnetic field may be insufficient. Moreover, when operating in the card mode, the NFC chip needs to drive another chip (such as a UIM (User Identity Module) chip) in the mobile phone system from the need to maintain the security of the mobile phone system or the like. Therefore, even when the NFC chip operates alone with the power supply from the magnetic field, it may be possible that the system does not operate.

However, if it is assumed that an external power supply is indispensable even when the NFC chip operates in the card mode, a problem may arise in the practical use thereof. For example, when a user of the mobile phone system has taken a train using the Suica (registered trademark) function embedded in the mobile phone system and then the battery of the mobile phone system is exhausted, the user can no longer use the Suica (registered trademark) function and go out a ticket wicket. Besides, as the NFC function has become more important as a social infrastructure, it has been considered that a system depending on an external power supply such as a battery has a problem.

To solve such a problem, e.g., an NFC chip compatible with a Low battery mode can be considered. This enables the NFC chip to operate even with a voltage lower than a voltage at which the mobile phone system can no longer operate. That is, when the battery of the mobile phone system is exhausted and the output voltage of the battery lowers, the system stops. The mobile phone system performs communication with a base station even when it is not actually used (for a phone call, an electronic mail, or the like) and consumes considerable battery power. Therefore, when the system has stopped, further battery power consumption is substantially suppressed. By configuring the NFC function such that it is operable even in this state, a battery lifetime in regard to the NFC function can significantly be elongated.

However, when the Low battery mode is used, the battery lifetime in regard to the NFC function can be elongated, but not infinitely, so that a fundamental solution is not provided. Even when the mobile phone system has stopped, the voltage of the battery gradually lowers due to battery power consumption by a leakage current, the self discharge of the battery, or the like and, finally, even the Low battery mode cannot handle the situation. Moreover, since the function of a battery (such as lithium battery) used in the mobile phone system as a secondary battery is impaired if over discharge occurs, when the voltage of the battery has lowered until the Low battery mode can no longer handle the situation, it is necessary to completely cut off the output of the battery. In this case, two-level threshold voltages are needed, and consequently the configuration of the mobile phone system may be complicated.

To prevent this, a system is desired which has provided an NFC chip with the function of generating power by rectifying input power from an antenna and can be used even when power is not supplied from the battery of the mobile phone system (a battery-less operation). At this time, as described above, it is necessary for the NFC chip to drive a chip (such as a UIM chip) other than itself so that, e.g., higher efficiency or the like is required of the power generating function. FIG. 23 is a schematic view showing an example of a configuration of a semiconductor device for wireless communication studied as an example on which the present invention is based. A semiconductor device (NFC chip) NFCIC' shown in FIG. 23 for wireless communication includes a rectifying circuit RECTC', a reception block RXBK, and a transmission block TXBK'.

The transmission block TXBK' is coupled to an external antenna ANT via transmission external terminals Ptp and Ptm and an external impedance matching circuit MACH. The antenna ANT is formed of an inductor, a Q value adjusting resistor, and the like. The reception block RXBK is coupled to the antenna ANT via reception external terminals Prp and Prn, amplitude limiting eternal resistors Rrp and Rrn, and dc cutting external capacitors Crp and Crn. The rectifying circuit RECTC' is coupled to the antenna ANT via power input external terminals Pvp and Pvn and dc cutting external capacitors Cvp and Cvn. When the semiconductor device NFCIC' operates in the RW mode, it operates with a battery (not shown), outputs a transmission signal from the transmission block TXBK' to the antenna ANT, and receives an input signal from the antenna ANT at the reception block RXBK. On the other hand, when the semiconductor device NFCIC' operates in the battery-less mode (mode in which the semiconductor device NFCIC' performs a card operation without using the power of the battery), the rectifying circuit RECTC' generates power using the input power supplied from the external reader/writer RW to the antenna ANT, and the reception block RXBK and the transmission block TXBK' operate using the power. Specifically, the reception block RXBK appropriately processes an input signal from the antenna ANT and thereby recognizes an instruction from the external reader/writer RW. When the semiconductor device NFCIC' performs transmission toward the external reader/writer RW, the transmission block TXBK' modulates a load between the transmission external terminals Ptp and Ptm and causes the external reader/writer RW to recognize a change in magnetic field that has resultantly occurred in the antenna ANT.

However, when a configuration as shown in FIG. 23 is used, there are matters of concern as shown below. First, an increase in the number of the external terminals Pvp and Pvn due to the rectifying circuit RECTC' is concerned. Since the terminals are power terminals, they exert significant influence on an area increase (cost increase) together with wiring lines in the chip. Next, degradation of power efficiency due to power leakage is concerned. A path from each of the external terminals Ptp and Ptm to the antenna ANT is designed so as to achieve sufficient impedance matching for a reduction in loss during transmission from the semiconductor device NFCIC'. A path from the antenna ANT to each of the external terminals Pvp and Pvn is also designed so as to achieve sufficient impedance matching for a reduction in input power loss. However, if each of the paths is designed to achieve sufficient impedance matching, in the RW mode, power transmitted from the semiconductor device NFCIC' may leak toward the rectifying circuit RECTC' to probably degrade the efficiency of antenna driving transistors. Conversely, in the battery-less mode, the input power from the antenna ANT may leak toward the transmission block TXBK' to probably degrade the efficiency of rectification.

The present invention has been achieved in view of the foregoing and an object thereof is to provide a semiconductor device for wireless communication which achieves a reduction in leakage power and allows an improvement in power efficiency. The above and other objects and novel features of the present invention will become apparent from a statement in the present specification and the accompanying drawings.

The following is a brief description of the outline of a representative embodiment of the invention disclosed in the present application.

A semiconductor device for wireless communication according to the present embodiment includes a first terminal serving as an antenna coupling terminal, a p-type first MISFET for pulling up the first terminal with a first power supply voltage serving as an external terminal, an n-channel second MISFET for pulling down the first terminal with a second power supply voltage serving as an external power supply, and a rectifying circuit section coupled to the first terminal. The rectifying circuit section uses an alternating current signal inputted to the first terminal via an antenna to generate a third power supply voltage having a value higher than that of the first power supply voltage and higher than that of a higher-potential voltage occurring at the first terminal when the foregoing alternating current has a maximum amplitude. The third power supply voltage is used as the bulk voltage of the first MISFET. As a result, it is possible to prevent rectifying power at the first terminal from leaking to a ground power supply voltage via a parasitic PNP bipolar transistor in the first MISFET and improve power efficiency.

Also, in the semiconductor device for wireless communication according to the present embodiment, the second MISFET includes a triple well structure, and a voltage level at the same potential as that of the second power supply voltage is supplied to an n-type semiconductor layer serving as a middle layer in the triple well structure. As a result, it is possible to prevent a current from leaking from the power supply to the first terminal through a parasitic NPN bipolar transistor in the second MISFET and improve power efficiency.

In addition, since this allows the first terminal to be used as each of an antenna driving terminal and a rectifying terminal, area and cost reduction can be achieved compared with the case where the antenna driving terminal and the rectifying terminal are separately provided. Moreover, since there is no power leakage between the individual terminals, power efficiency can be improved.

The following is a brief description of an effect obtained according to the representative embodiment of the invention disclosed in the present application. That is, in the semiconductor device for wireless communication having each of a reader/writer function and the function of an IC card or the like, leakage power can be reduced and power efficiency can be improved.

BRIEF DESCRIPTION OF THE DRAWINGS

FIG. 9 is a supplementary view of FIG. 8;

FIGS. 11(a) and 11(b) show an example of operation of the antenna driver driving section of FIG. 10, of which FIG. 11(a) is a waveform chart during a RW mode period and FIG. 11(b) is a waveform chart during a card mode (battery-less mode) period;

FIG. 16 is a truth table showing, in the rectification regulator of FIG. 14, an example of operation of a logic circuit section thereof;

FIGS. 18(a) and 18(b) show a detail of a carrier detecting section in the transmission block of FIG. 7, of which FIG. 18(a) is a circuit diagram showing an example of a configuration thereof and FIG. 18(b) is a waveform chart showing an example of operation in FIG. 18(a);

FIG. 21 is a supplementary view of FIG. 20;

DETAILED DESCRIPTION

Figure 1:
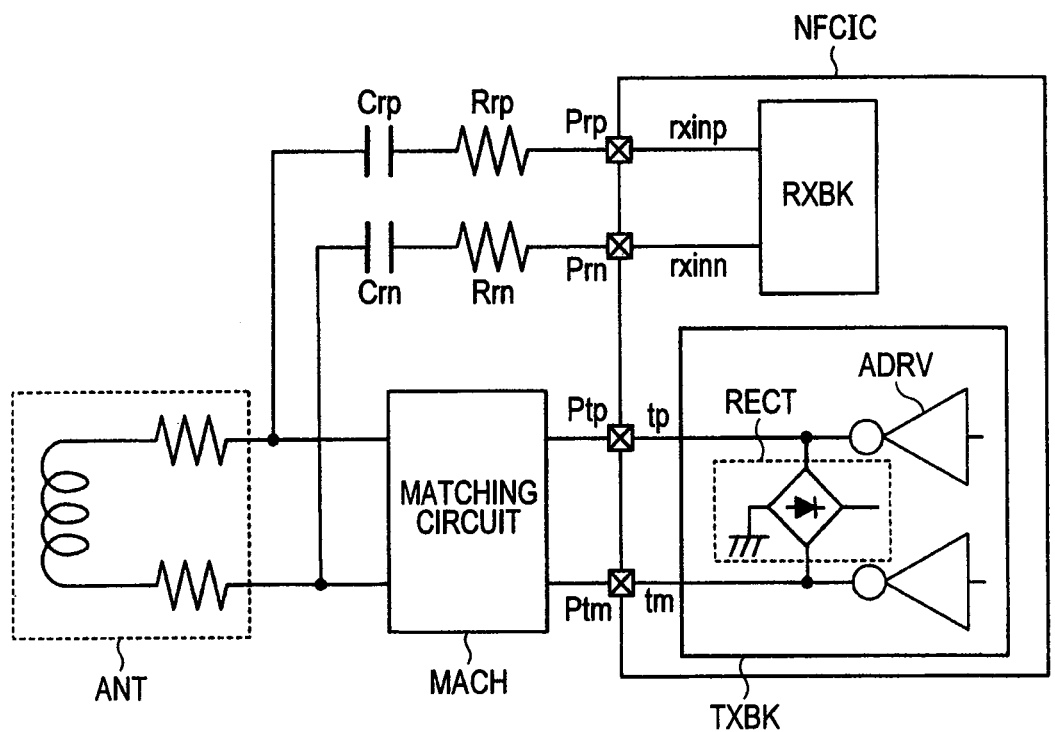
FIG. 1 is a schematic view showing an example of an overall configuration of a semiconductor device for wireless communication according to an embodiment of the present invention.

In each of the following embodiments, if necessary for the sake of convenience, the embodiment will be described by being divided into a plurality of sections or embodiments. However, they are by no means irrelevant to each other unless particularly explicitly described otherwise, and one of the sections or embodiments is variations, details, supplementary explanation, and so forth of part or the whole of the others. When the number and the like (including the number, numerical value, amount, range, and the like) of elements are mentioned in the following embodiments, they are not limited to specific numbers unless particularly explicitly described otherwise or unless they are obviously limited to specific numbers in principle. The number and the like of the elements may be not less than or not more than specific numbers.

It will be appreciated that, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto unless particularly explicitly described otherwise or unless it can be considered that they obviously do not in principle. The same shall apply in regard to the foregoing numerical value and range.

Circuit elements forming each of functional blocks of the embodiments are not particularly limited, but are formed over a semiconductor substrate of monocrystalline silicon or the like by an integrated circuit technology such a known CMOS (complementary MOS transistor) technology. In the embodiments, as an example of a MISFET (Metal Insulator Semiconductor Field Effect Transistor), a MOSFET (Metal Oxide Semiconductor Field Effect Transistor) (abbreviated as MOS transistor) is used, but it is not intended to exclude a non-oxide film from examples of a gate insulating film.

Referring to the drawings, the embodiments of the present invention will be described below in detail. Note that, throughout all the drawings for illustrating the embodiments, like members are designated by like reference numerals in principle, and a repeated description thereof is omitted.

<Schematic Configuration of Entire NFC Chip>

FIG. 1 is a schematic view showing an example of an overall configuration of a semiconductor device for wireless communication according to an embodiment of the present invention. A semiconductor device (NFC chip) NFCIC for wireless communication shown in FIG. 1 is configured to include a transmission block TXBK, a reception block RXBK, and a rectifying section RECT provided in the transmission block TXBK. The transmission block TXBK is coupled to an external antenna ANT via transmission (antenna driving) external terminals Ptp and Ptm and an external impedance matching circuit MACH. The antenna ANT includes an inductor, a Q value adjusting resistor, and the like. The reception block RXBK is coupled to the antenna ANT via reception external terminals Prp and Prn, amplitude limiting external resistors Rrp and Rrn, and dc cutting external capacitors Crp and Crn. The semiconductor device NFCIC has a RW mode in which it operates as a reader/writer RW using the power of a battery (not shown), and a card mode and a battery-less mode in each of which it operates as an IC card. In the card mode, the power of the battery is used while, in the battery-less mode, the power of the battery is not used.

The transmission block TXBK includes the rectifying section RECT and an antenna driver section ADRV. During writing (during transmission) in the RW mode, the antenna driver ADRV in the transmission block TXBK outputs transmission signals (tp and tm) toward the transmission external terminals Ptp and Ptm, which are outputted from the antenna ANT via the impedance matching circuit MACH. During reading (during reception) in the RW mode, input signals (return signals from the communication partner) from the antenna ANT are transmitted to the reception external terminals Prp and Prn via the dc cutting external capacitors Crp and Crn or the like, which are processed appropriately as reception signals (rxinp and rxinn) by the reception block RXBK. On the other hand, when the semiconductor device NFCIC operates in the battery-less mode, input power supplied from the external reader/writer (RW) to the antenna ANT is transmitted as the power signals (tp and tm) to the external terminals Ptp and Ptm. Using the power signals (tp and tm), the rectifying section RECT generates power and, using the power, the reception block RXBK and the antenna driver section ADRV operate. Specifically, the reception block RXBK appropriately processes the input signals from the antenna ANT and thereby recognizes an instruction from the external reader/writer (RW). When the semiconductor device NFCIC returns a reply to the external reader/writer RW, the antenna driver section ADRV modulates the load between the external terminals Ptp and Ptm and causes the external reader/writer RW to recognize a change in magnetic field that has resultantly occurred in the antenna ANT. Note that, when the semiconductor device NFCIC operates in the card mode, the operation is the same as that in the battery-less mode described above except that the operating power of the reception block RXBK and the antenna driver section ADRV is replaced with battery power.

Figure 23:
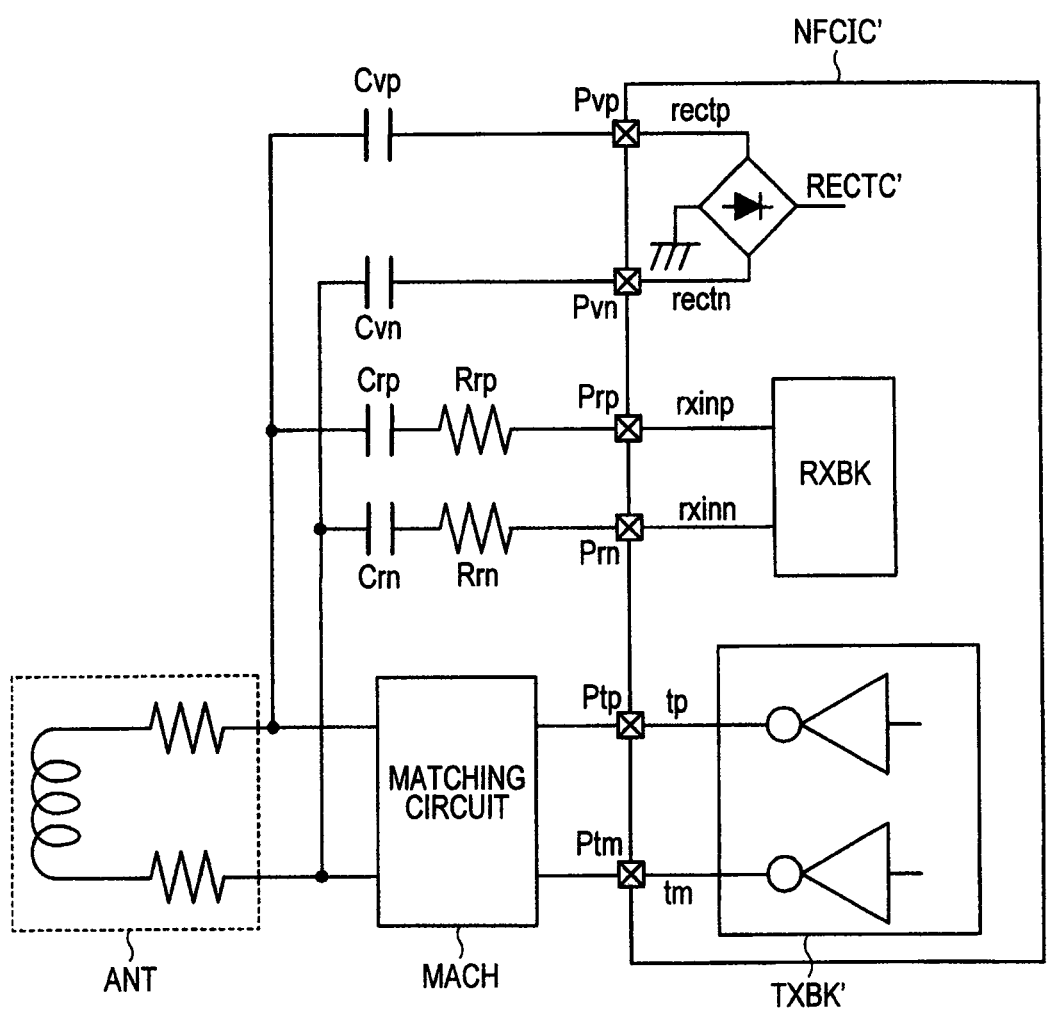
FIG. 23 is a schematic view showing an example of a configuration of a semiconductor device for wireless communication studied as an example on which the present invention is based.

If such a configuration example is used, compared with the case where the configuration example of FIG. 23 described above is used, the number of the external terminals can be reduced to achieve reductions in the size and cost of the NFC chip (and a system to which it is applied). In addition, it is possible to reduce transmission power leakage in the antenna driver section ADRV during transmission in the RW mode and the leakage of the input power from the antenna ANT not to the rectifying section RECT, but to the antenna driver section ADRV in the battery-less mode, as described with reference to FIG. 23.

A description will be given to the former transmission power leakage in the antenna driver section ADRV. When a configuration example as shown in FIG. 23 is used, if external terminals Pvp and Pvn can be set into, e.g., a no-load state (open state) or the like, the transmission power leakage (a loss in effective power) can be reduced. However, if the external terminals Pvp and Pvn are actually brought into the no-load state or the like, amplitudes at the external terminals Pvp and Pvn may be excessively increased by, e.g., LC resonance of an external component or the like to exceed the breakdown voltages of transistors. Therefore, it is actually necessary to limit the amplitudes using any resistance load so that a loss undesirably occurs in effective power. In addition, in various external components present in paths from the external terminals Ptp and Ptm to the external terminals Pvp and Pvn, resistive components actual exist, which may also cause a loss in effective power.

To prevent this, if the transmission (antenna driving) external terminals Ptp and Ptm are used also as rectification external terminals as in the configuration example of FIG. 1, during a RW mode period, e.g., the rectifying section RECT is brought into the OFF state to allow a reduction in transmission power leakage (a loss in effective power). That is, during the RW mode period, the potential at each of the external terminals Ptp and Ptm is driven by an internal circuit to be set to a power supply voltage or ground voltage. Accordingly, the potentials at the external terminals Ptp and Ptm are limited to the range from the ground power supply voltage to the power supply voltage. A rectified power supply generated by a rectifying circuit using a diode bridge cannot exceed an input amplitude in principle. Therefore, when the rectified power supply is opened, after a potential of a given level is reached, a rectifying operation is no longer performed so that the rectifying section RECT is turned OFF. At this time, with regard to the breakdown voltages of the transistors, the antenna driver section ADRV generates transmission power to the external terminals Ptp and Ptm during the RW mode period, as described above, so that the power supply voltage of the antenna driver section ADRV is not exceeded.

On the other hand, in the same manner as during the latter battery-less mode period also, by controlling the antenna driver section ADRV into an OFF state, the rectifying section RECT can rectify the power inputted to the antenna driving external terminals Ptp and Ptm with no loss. However, if the rectifying section RECT is only simply coupled to the external terminals Ptp and Ptm, large leakage power may occur in the transmission block TXBK during the rectifying operation, as illustrated in FIG. 2. In the semiconductor device for wireless communication according to the present embodiment, it is a main characteristic feature thereof to find the problem and take measures (details thereof will be described later) against the problem.

<Example of Problem in Transmission Block>

Figure 2A:
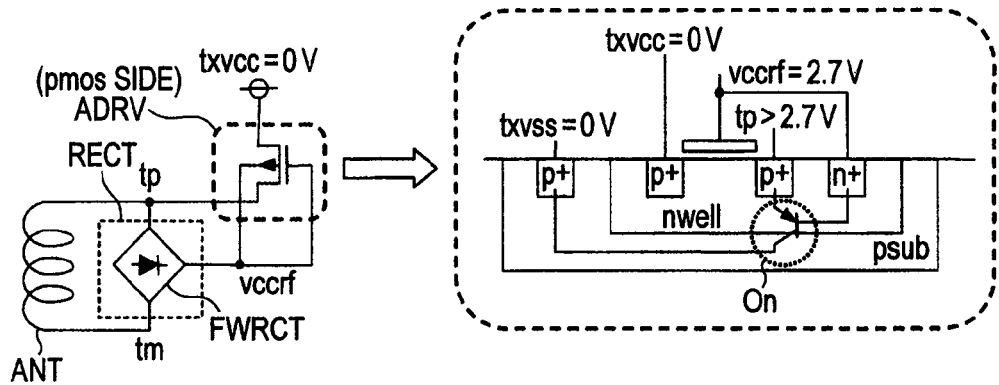
FIGS. 2(a) to 2(c) are illustrative views showing, in the semiconductor device for wireless communication of FIG. 1, a problem when a rectifying section is simply coupled to antenna driving external terminals.
Figure 2B:
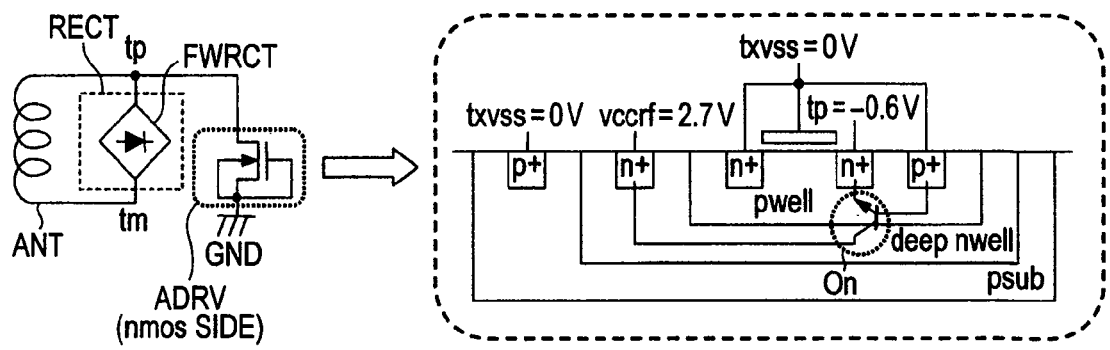
Figure 2C:
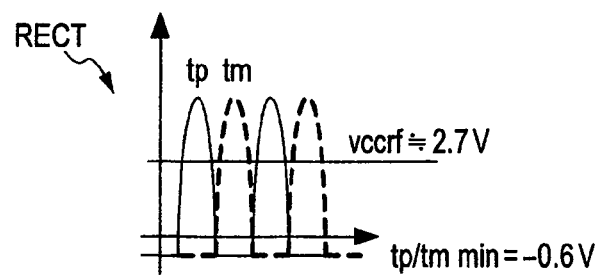

FIGS. 2(a) to 2(c) are illustrative views showing, in the semiconductor device for wireless communication of FIG. 1, the problem when the rectifying section is simply coupled to the antenna driving external terminals. FIG. 2(a) schematically shows the state of a pull-up PMOS transistor in the antenna driver section ADRV during the battery-less mode period. In this example, as shown in FIGS. 2(a) and 2(c), the pull-up PMOS transistor has been turned OFF at a power supply voltage (vccrf (e.g., 2.7 V)) generated by a full-wave rectifying circuit FWRCT in the rectifying section RECT. Since it is during the battery-less mode period, an external power supply voltage (txvcc) supplied from the battery for antenna driving is 0 V. At this time, since the power supply voltage (vccrf) is obtained by rectifying the power signals (tp and tm), the potentials of the power signals (tp and tm) may exceed the power supply voltage (vccrf), as shown in FIG. 2(c). In this case, the pull-up PMOS transistor operates using each of the signals (tp and tm) as a source and the external power supply voltage (txvcc) as a drain. At this time, if "tp (or tm)−vccrf>Vthp" is satisfied, a current reversely flows from each of the signals (tp and tm) to the power supply voltage (txvcc) (=0 V) to inhibit the rectifying operation.

Also, as shown in FIG. 2(a), in the pull-up PMOS transistor, there is a parasitic PNP bipolar transistor using a $p^+$-type diffusion layer ($p^+$) as an emitter, an n-type well (nwell) as a base, and a p-type semiconductor substrate (psub) as a collector. To the $p^+$-type diffusion layer ($p^+$), the signals (tp and tm) are applied. To the p-type semiconductor substrate (psub), a ground power supply voltage (txvss) (=0 V) against the power supply voltage (txvcc) is applied. During a normal period, the power supply voltage (vccrf), which is the highest potential, is applied as the back bias (bulk voltage) of the pull-up PMOS transistor to an n-type well (nwell) without causing any problem. However, since "tp (or tm)−vccrf>0.6 V" may actually be satisfied as shown in FIG. 2(c), the parasitic PNP bipolar transistor is turned ON, and a current flows from each of the signals (tp and tm) to the ground power supply voltage (txvss) (=0 V), which has the potential of the p-type substrate (psub), to inhibit the rectifying operation.

As shown in FIG. 2(b), the same problem occurs also in a pull-down NMOS transistor in the antenna driver section ADRV. FIG. 2(b) schematically shows the state of the pull-down NMOS transistor in the antenna driver section ADRV during the battery-less mode period. In this example, the pull-down NMOS transistor has been turned OFF at the ground power supply voltage (txvss (=0 V)). In the current CMOS process, a triple well structure is fundamental. The p-type well (pwell) of the pull-down NMOS transistor is isolated by a deep n-type well (deep nwell) covering the p-type well (pwell) from the p-type semiconductor substrate (psub). In this case, in the pull-down NMOS transistor, there is a parasitic NPN bipolar transistor using an $n^+$-type diffusion layer ($n^+$) as an emitter, the p-type well (pwell) as a base, and the deep n-type well (deep well) as a collector.

To the $n^+$-type diffusion layer ($n^+$), the signals (tp and tm) are applied. To the p-type well (pwell), the power supply voltage (txvss) (=0 V), which is the lowest potential, is applied as the back bias (bulk voltage) of the pull-down NMOS transistor. In general, the deep n-type well (deep nwell) is coupled to the power supply voltage (vccrf). However, as shown in FIG. 2(c), when the rectifying operation is performed, the signals (tp and tm) may drop to a level of −0.6 V. As a result, a large current flows to the collector of the parasitic NPN bipolar transistor to extract a current from the power supply voltage (vccrf).

Thus, when the rectifying section RECT is simply coupled to the antenna driving external terminals Ptp (signal tp) and Ptm (signal tm), during the battery-less mode period, leak paths are formed between the external terminals Ptp and Ptm and the transistors in the antenna driver section ADRV to inhibit the operation of the rectifying section RECT. Note that, when a configuration example as shown in, e.g., FIG. 23 is used, the rectification external terminals (Pvn and Pvp) and the antenna driving external terminals Ptp and Ptm are isolated from each other by external capacitors Cvp and Cvn or the like. Since the antenna driver section is not directly coupled to the external terminals Pvn and Pvp, a problem as illustrated in FIG. 2 does not occur. However, in the configuration example of FIG. 23, there is another problem as described above so that it is desired to solve the problem of FIG. 2 in the configuration example of FIG. 1.

<Schematic Configuration of NFC Chip (Main Portion)>

Figure 3:
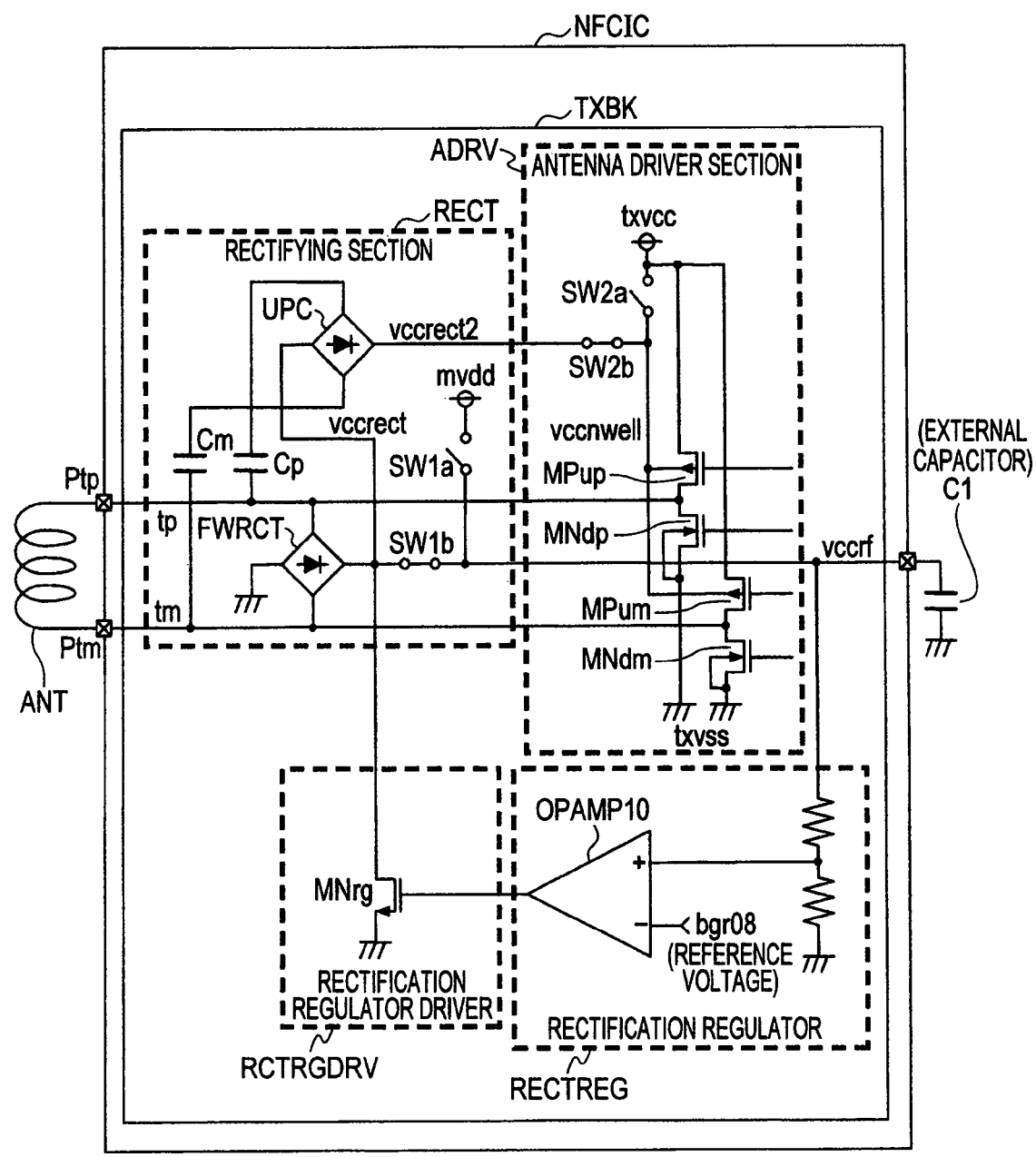
FIG. 3 is a circuit block diagram showing, in the semiconductor device for wireless communication of FIG. 1, an example of a detailed configuration of the main portion thereof.

FIG. 3 is a circuit block diagram showing, in the semiconductor device for wireless communication of FIG. 1, an example of a detailed configuration of the main portion thereof, which is the configuration example for solving the problem described with reference to FIG. 2. The NFC chip NFCIC shown in FIG. 3 includes the rectifying section RECT, the antenna driver section ADRV, a rectification regulator driver RCTRGDRV, and a rectification regulator RECTREG in the transmission block TXBK.

The rectifying section RECT includes the full-wave rectifying circuit FWRCT, a voltage boosting circuit UPC, switches SW1a and SW1b, and capacitors Cm and Cp. The full-wave rectifying circuit FWRCT performs full-wave rectification of the power signals (tp and tm) inputted from the antenna ANT using the ground power supply voltage as a reference to generate a power supply voltage (vccrect). The voltage boosting circuit UPC receives the power signals (tp and tm) described above via the capacitors Cm and Cp and performs full-wave rectification thereof using the power supply voltage (vccrect) from the full-wave rectifying circuit FWRCT as a reference to generate a power supply voltage (vccrect2). The turning ON/OFF of the switches SW1a and SW1b are complementarily controlled. In the battery-less mode, the power supply voltage (vccrect) is outputted as the power supply voltage (vccrf) and, otherwise (in the card mode or RW mode), a power supply voltage (mvdd) from the battery is outputted as the power supply voltage (vccrf).

The antenna driver section ADRV includes PMOS transistors MPup and MPum, NMOS transistors MNdp and MNdm, and switches SW2a and SW2b. The PMOS transistor MPup pulls up one terminal (external terminal Ptp) of the antenna ANT with the antenna driving power supply voltage (txvcc) from the battery, while the NMOS transistor MNdp pulls down the external terminal Ptp with the antenna driving ground power supply voltage (txvss) from the battery. The PMOS transistor MPum pulls up the other terminal (external terminal Ptm) of the antenna ANT with the power supply voltage (txvcc), while the NMOS transistor MNdm pulls down the external terminal Ptm with the power supply voltage (txvss). The switches SW2a and SW2b complementarily operate and supply the boosted power supply voltage (vccrect2) from the rectifying section RECT as the back bias (bulk voltage) of each of the PMOS transistors MPup and MPum during the battery-less mode period or supply the power supply voltage (txvcc) as the back bias of each of the PMOS transistors MPup and MPum during another mode period (card mode period or RW mode period).

The rectification regulator RECTREG includes an operational amplifier circuit OPAMP10, and the rectification regulator driver RCTRGDRV includes an NMOS transistor MNrg. The operational amplifier circuit OPAMP10 compares a resistance-divided voltage of the power supply voltage (vccrf) with a reference voltage (bgr08) and drives the gate of the NMOS transistor MNrg using the result of the comparison. The NMOS transistor MNrg has the source thereof coupled to the ground power supply voltage and the drain thereof coupled to the power supply voltage (vccrect). Therefore, when the power supply voltage (vccrf) is higher than a predetermined voltage (e.g., 2.7 V), the operational amplifier circuit OPAMP10 lowers the power supply voltage (vccrect) via the NMOS transistor MNrg and resultantly lowers the power supply voltage (vccrf) via the switch SW1b.

Figure 4A:
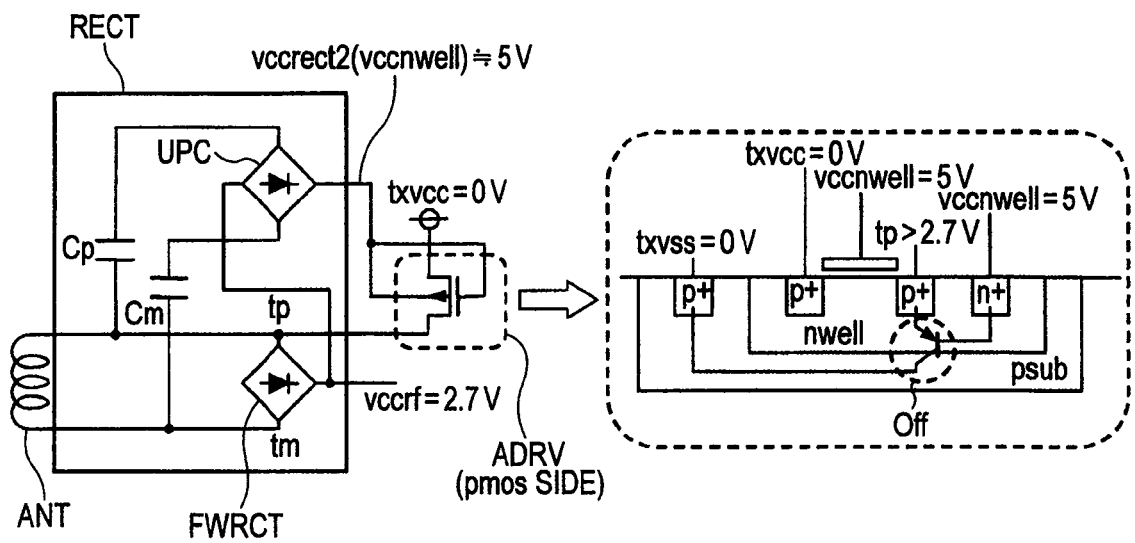
FIGS. 4(a) to 4(c) are illustrative views showing, in the semiconductor device for wireless communication of FIG. 3, an example of operation thereof during a battery-less mode period.
Figure 4B:
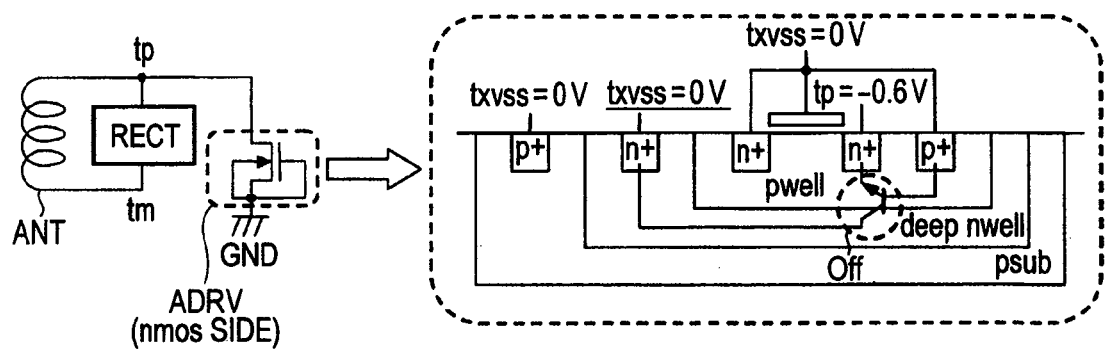
Figure 4C:
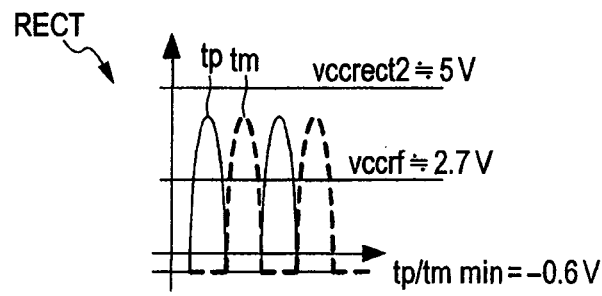

FIGS. 4(a) to 4(c) are illustrative views showing, in the semiconductor device for wireless communication of FIG. 3, an example of operation thereof during the battery-less mode period. FIG. 4(a) schematically shows the state of the pull-up PMOS transistor (MPup or MPum) in the antenna driver section ADRV during the battery-less mode period. In this example, as shown in FIGS. 4(a) and 4(c), the pull-up PMOS transistor has been turned OFF at the power supply voltage (vccrect2 (e.g., 5 V)) generated by the voltage boosting circuit UPC in the rectifying section RECT. Since it is during the battery-less mode period, the external power supply voltage (txvcc) supplied for antenna driving from the battery is 0 V. At this time, as shown in FIG. 2(c), the potentials of the power signals (tp and tm) may exceed the power supply voltage (vccrf) (=2.7 V) from the full-wave rectifying circuit FWRCT, but does not exceed the power supply voltage (vccrect2). As a result, unlike in the case of FIG. 2(a), the pull-up PMOS transistor is not turned ON and therefore it is possible to prevent the rectifying operation from being inhibited.

Also, as shown in FIG. 4(a), in the pull-up PMOS transistor, there is the parasitic PNP bipolar transistor using the $p^+$-type diffusion layer ($p^+$) as the emitter, the n-type well (nwell) as the base, and the p-type semiconductor substrate (psub) as the collector. To the $p^+$-type diffusion layer ($p^+$), the signals (tp and tm) are applied. To the p-type semiconductor substrate (psub), the ground power supply voltage (txvss) (=0 V) against the power supply voltage (txvcc) is applied. Here, unlike in the case of FIG. 2(a), the n-type well (nwell) is supplied with the boosted power supply voltage (vccrect2 (e.g., 5 V)). In this case, the potentials of the signals (tp and tm) each serving as the emitter do not exceed the potential of the power supply voltage (vccrect2) serving as the base, and the parasitic PNP bipolar transistor retains the OFF state. Therefore, it is possible to prevent the rectifying operation from being inhibited.

On the other hand, FIG. 4(b) schematically shows the state of the pull-down NMOS transistor (MNdp or MNdm) in the antenna driver section ADRV. In this example, the pull-down NMOS transistor has been turned OFF at the ground power supply voltage (txvss (=0 V)). The pull-down NMOS transistor is formed to have the triple well structure, and the p-type well (pwell) serving as a channel region is isolated from the p-type semiconductor substrate (psub) by the deep n-type well (deepnwell) covering the p-type well (pwell). In this case, in the pull-down NMOS transistor, there is the parasitic NPN bipolar transistor using the $n^+$-type diffusion layer ($n^+$)

as the emitter, the p-type well (pwell) as the base, and the deep n-type well (deep nwell) as the collector.

To the $n^+$-type diffusion layer ($n^+$), the signals (tp and tm) are applied. To the p-type well (pwell), the ground power supply voltage (txvss) (=0 V), which is the lowest potential, is applied as the back bias (bulk voltage) of the pull-down NMOS transistor. Here, unlike in the case of FIG. 2(b), the deep n-type well (deep nwell) is supplied with the ground power supply voltage (txvss (=0 V)). Therefore, as shown in FIG. 4(c), even when the signals (tp and tm) drop to a level of about −0.6 V while the rectifying operation is performed, the collector of the parasitic NPN bipolar transistor is at 0 V. Accordingly, there is no flow of a large current and no extraction of a current from the power supply voltage (vccrf) so that it is possible to prevent the rectifying operation from being inhibited. Note that, even when the deep n-type well (deep nwell) is coupled to 0 V, if there is no PMOS transistor in the deep n-type well, no particular problem arises.

Thus, by using the semiconductor device (NFC chip) for wireless communication of each of FIGS. 1 and 3, it is possible to reduce leakage power during the rectifying operation and a transmitting operation and achieve an improvement in power efficiency. Note that, in the antenna driver section ADRV of FIG. 3, the switches SW2a and SW2b are provided because, here, the power supply voltage (vccrect2) is fixed to a value in the vicinity of 0 V when the rectifying operation is stopped in a mode other than the battery-less mode. That is, at this time, a voltage (vccnwell) serving as the back bias and OFF voltage of the pull-up PMOS transistor is switched to the power supply voltage (txvcc) from the battery.

In the configuration example of FIG. 3, by detecting the value of the power supply voltage (vccrf) with the rectification regulator RECTREG and controlling the power supply voltage (vccrect) of the full-wave rectifying circuit FWRCT with the rectification regulator driver RCTRGDRV, the value of the power supply voltage (vccrf) is indirectly controlled. This is because a low-pass filter effect due to the resistance of the switch SW1b and an external capacitor C1 with respect to the power supply voltage (vccrf) allows easier power supply control than when the power supply voltage (vccrect) is directly controlled and consequently allows stabilization of the power supply voltage (vccrf). That is, since a variation in power supply voltage (vccrf) is reduced by the low-pass filter effect to be smaller than a variation in power supply voltage (vccrect), selecting the power supply voltage (vccrf) as a control target consequently allows greater stabilization of the power supply voltage (vccrf).

<Comparative Example of Pull-Up PMOS Transistor>

Figure 24:
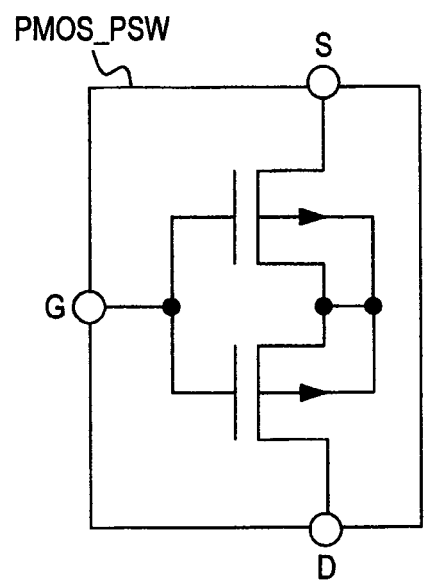
FIG. 24 is a circuit diagram showing an example of a configuration of a pull-up PMOS transistor studied as a comparative example of FIG. 3.

FIG. 24 is a circuit diagram showing an example of a configuration of a pull-up PMOS transistor studied as a comparative example of FIG. 3. In FIG. 3, by controlling the back bias of each of the pull-up PMOS transistors MPup and MPum, power leakage during the rectifying operation is prevented. However, power leakage can also be prevented by providing each of the pull-up PMOS transistors with a configuration as shown in FIG. 24. In FIG. 24, each of the pull-up PMOS transistors is formed of two series-coupled PMOS transistors and, through the coupling of the back biases of the two PMOS transistors to commonly coupled nodes, a maximum potential is supplied as the back bias. However, when such a configuration example is used, a gate length is doubled as a result of the series coupling so that, to ensure the same driving ability as that of the pull-up PMOS transistor of FIG. 3, it is necessary to also double a gate width. Consequently, a transistor area which is quadruple that in the case of FIG. 3 is needed. In particular, since the pull-up PMOS transistors MPup and MPum of FIG. 3 and the like are for antenna driving, the sizes thereof are originally large, which is significantly disadvantageous in a configuration example as shown in FIG. 24.

<Schematic Configuration of Mobile Phone System>

Figure 5:
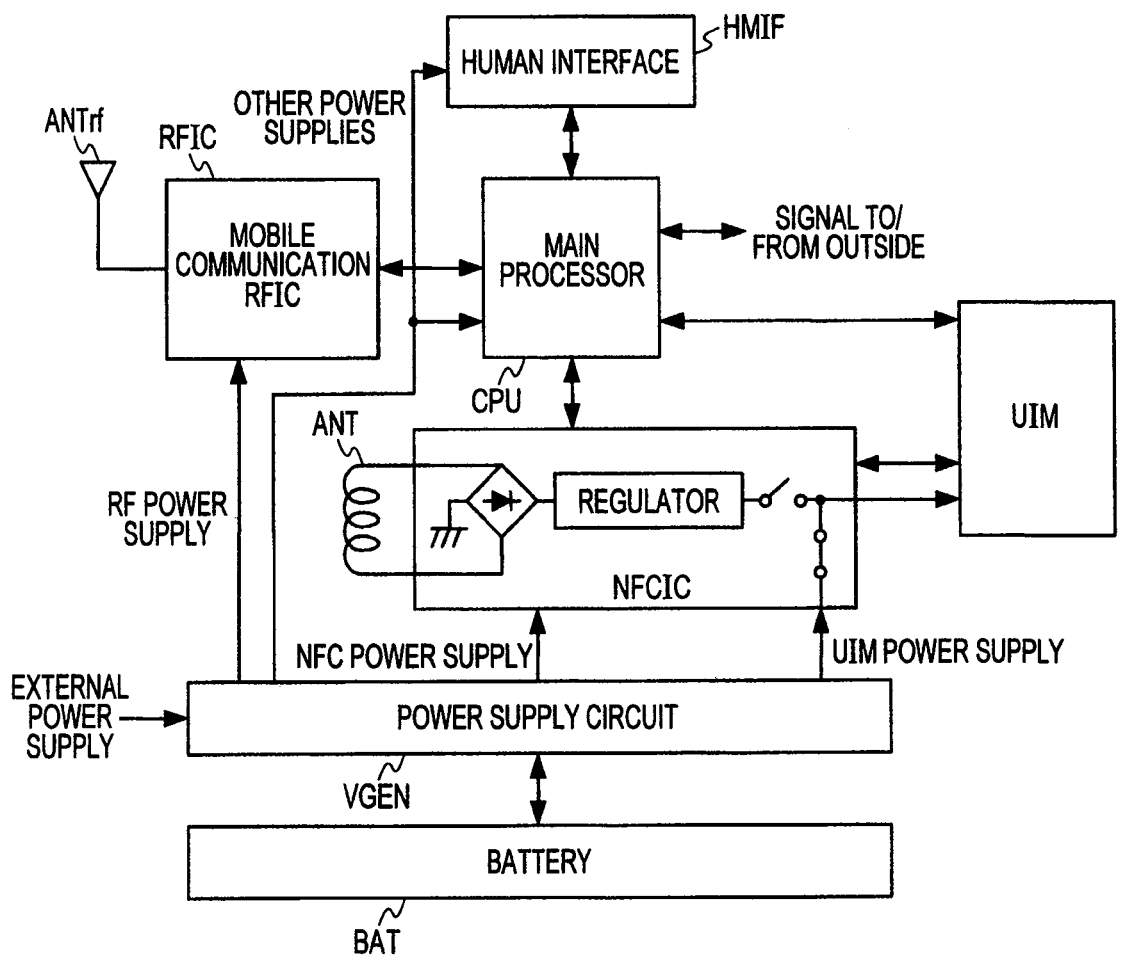
FIG. 5 is a block diagram showing an example of a configuration of a mobile phone system to which the semiconductor device for wireless communication according to the embodiment of the present invention is applied.

FIG. 5 is a block diagram showing an example of a configuration of a mobile phone system to which the semiconductor device for wireless communication according to the embodiment of the present invention is applied. The mobile phone system shown in FIG. 5 includes a battery BAT, a power supply circuit VGEN, the NFC chip NFCIC, a short-distance antenna ANT, a UIM chip UIM, a mobile communication RF processor RFIC, a long-distance antenna ANTrf, a main processor CPU, a human interface HMIF, and the like. The power supply circuit VGEN is supplied with power from the battery BAT or another external power supply and generates various power supplies including an NFC power supply, a UIM power supply, an RF power supply, and other power supplies. The mobile communication RF processor RFIC operates with the RF power supply to appropriately control communication between the main processor CPU and the outside of the mobile phone system via a radio signal in a range of, e.g., several hundreds of megahertz to several gigahertz in the short-distance antenna ANT. The human interface HMIF operates with the power supply from the power supply circuit VGEN to perform various user processes such as, e.g., reporting information inputted from various buttons or the like to the main processor CPU or effecting predetermined display on a display in accordance with information from the main processor CPU.

The NFC chip NFCIC corresponds to the semiconductor device for wireless communication according to the present embodiment. The NFC chip NFCIC operates with the NFC power supply from the power supply circuit VGEN in the RW mode or card mode described above to appropriately control communication between the main processor CPU and the outside of the mobile phone system via, e.g., an electromagnetic field signal of 13.56 MHz in the short-distance antenna ANT. On the other hand, in the battery-less mode, the NFC chip NFCIC generates a power supply from power inputted thereto from the short-distance antenna ANT and operates therewith. Here, during a card mode period or a battery-less mode period, the NFC chip NFCIC performs predetermined communication with the UIM chip UIM (e.g., SIM card (Subscriber Identity Module Card)). At this time, the NFC chip NFCIC needs to supply operating power toward the UIM chip UIM. Therefore, the NFC chip NFCIC supplies the UIM power from the power supply circuit VGEN in the card mode, while supplying the power generated using the power inputted thereto from the short-distance antenna ANT in the battery-less mode. Accordingly, in the battery-less mode, rectification efficiency in the rectifying section RECT described above is particularly important so that the use of the NFC chip according to the present embodiment is useful.

<Detailed Configuration of (Entire) NFC Chip>

Figure 6:
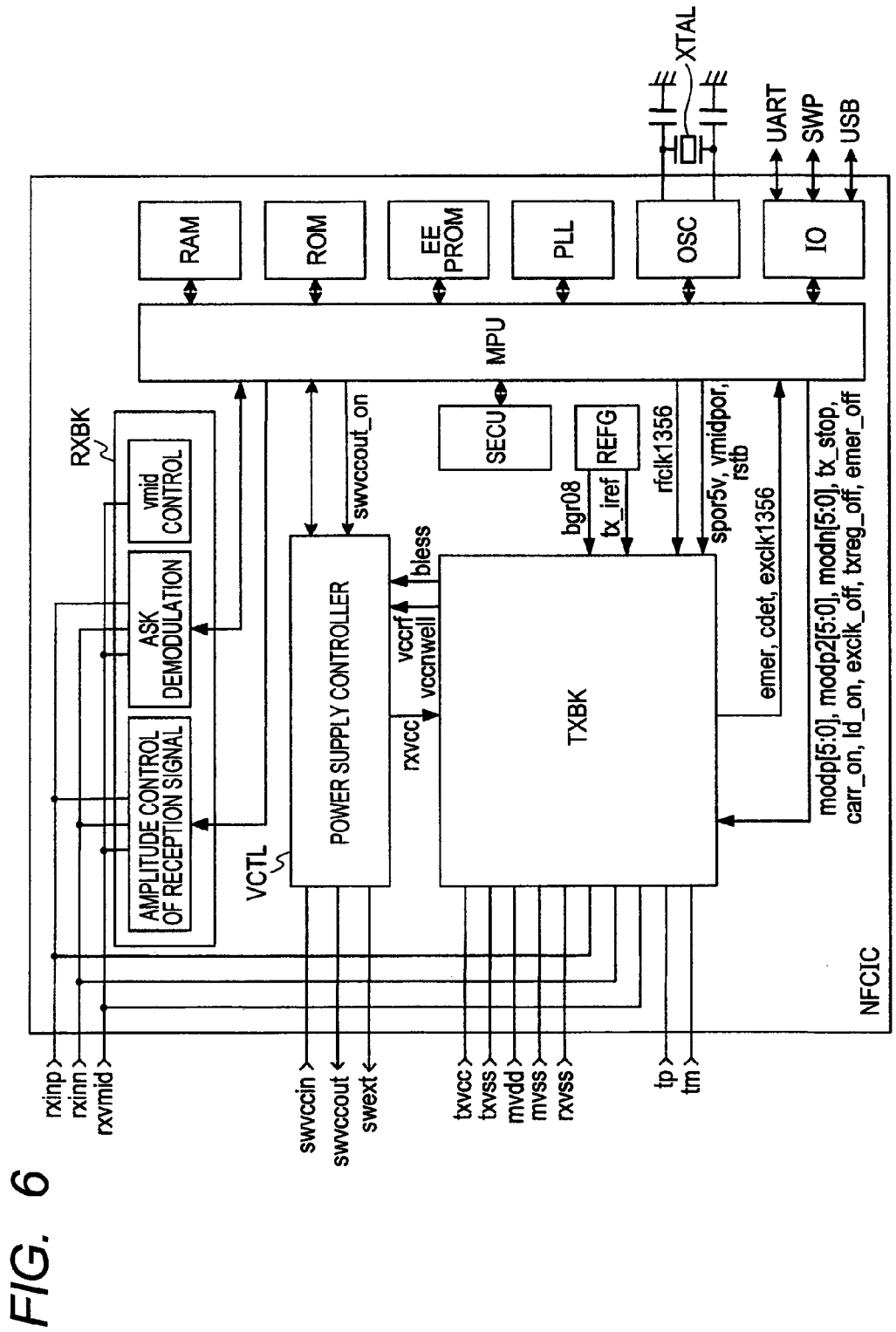
FIG. 6 is a block diagram showing an example of a more detailed configuration of the entire semiconductor device for wireless communication of FIG. 1.

FIG. 6 is a block diagram showing an example of a more detailed configuration of the entire semiconductor device for wireless communication of FIG. 1. The semiconductor device (NFC chip) NFCIC for wireless communication shown in FIG. 6 is formed over, e.g., one semiconductor chip and includes the transmission block TXBK, a power supply controller VCTL, the reception block RXBK, and various control blocks which perform communication centered around the microprocessor MPU via the transmission block TXBK and the reception block RXBK and control of the transmission block TXBK, the reception block RXBK, and the power supply controller VCTL. To the microprocessor MPU, various peripheral circuits are coupled via internal buses (not shown) or the like. The various peripheral circuits include a volatile memory RAM, a nonvolatile memory ROM, an EEPROM (Electrically Erasable and Programmable Read Only Memory), a phase-locked loop circuit PLL, an oscillation circuit OSC, an external input/output circuit IO, a security-related circuit SECU, and the like.

The oscillation circuit OSC generates a reference clock signal based on an external crystal oscillator XTAL or the like. The phase-locked loop circuit PLL generates an internal clock signal at a predetermined frequency using the reference clock signal. The external input/output circuit IO controls communication between the microprocessor MPU and the outside via, e.g., a UART (Universal Asynchronous Receiver Transmitter), a SWP (Single Wire Protocol), a USB (Universal Serial Bus), or the like. Communication between the microprocessor MPU and the UIM chip (UIM) is performed via SWP. The microprocessor MPU executes a predetermined program (such as a control program for RW mode or a control program for IC card) using the RAM, the ROM, and the EEPROM and ensures security using the security-related circuit SECU in the process thereof.

The transmission block TXBK is supplied with the power supply voltages (for antenna driving (txvcc/txvss) and for the entire transmission block (mvdd/mvss)) generated from the battery and generates the antenna driving transmission signals (tp and tm), while performing communication using various signals with the microprocessor MPU. Also, the transmission block TXBK rectifies the power signals (tp and tm) from an antenna (not shown) to generate the power supply voltages (vccrf and vccnwell) during the battery-less mode period, as described above. The transmission block TXBK is also supplied with power supply voltages (rxvcc/rxvss) for the reception block, the reference voltage (band gap voltage) (bgr08) from a reference generating circuit REFG, a reference current (tx_iref), and the like.

The reception block RXBK receives the reception signals (rxinp and rxinn) and a reception reference voltage (rxvmid) (common voltage between the reception signals (rxinp and rxinn)) each inputted thereto from the antenna, demodulates the reception signals subjected to ASK (Amplitude shift keying) modulation, and outputs the demodulated reception signals to the microprocessor MPU. At this time, the reception block RXBK also performs level control of the reference voltage (rxvmid), amplitude control of the reception signals, and the like. The power supply controller VCTL receives a SWP power supply voltage (swvccin) from the battery and supplies, in accordance with a control signal (swvccout_on) from the microprocessor MPU, a SWP power supply voltage (swvcout) toward a SWP device (i.e., UIM chip) coupled to the external input/output circuit IO. At this time, the power supply controller VCTL generates the SWP power supply voltage (swvccout) based on the power supply voltages (vccrf and vccnwell) supplied from the transmission block TXBK in the battery-less mode. In another mode, the power supply controller VCTL generates the SWP power supply voltage (swvccout) based on the SWP power supply voltage (swvccin). Note that a control signal (swext) from the power supply controller VCTL is used as, e.g., an ON/OFF signal for an external switch or the like on such an occasion as when the SWP power supply voltages (swvccin and swvccout) are coupled via the external switch. The power supply controller VCTL also supplies the reception block power supply voltage (rxvcc) described above toward the transmission block TXBK.

In such a configuration, the transmission block TXBK performs predetermined operations in accordance with the RW mode, the card mode, and the battery-less mode each described above and also performs an operation in an RF sensor mode (RFS mode), a clock extracting operation, and the like. The following is a brief description of the outline of these operations. First, in the RW mode, the transmission block TXBK receives a control signal (carr_on) on a 'H' level from the microprocessor MPU and drives the external antenna with a driving force set by control signals (mod p[5:0] and mod n[5:0]) from the microprocessor MPU. At this time, through appropriate control of control signals (mod p[5:0], mod p2_[5:0], and mod n[5:0]) from the microprocessor MPU, the transmission block TXBK generates an ASK modulation signal. The values of the control signals (mod p[5:0], mod p2_[5:0], and mod n[5:0]) can be appropriately changed by a register circuit (not shown) provided in the microprocessor MPU. The transmission block TXBK outputs a detection signal (emer) in the case where, when the control signal (carr_on) is on the 'H' level, a high voltage (e.g., about txvcc+0.6 V) occurs in the transmission signal (tp/tm) (i.e., such as when an intense magnetic field is inputted into a reverse current from the antenna or an output of the antenna).

Next, in the card mode, the transmission block TXBK performs a load modulating operation (i.e., a reply toward the external reader/writer RW) at an intensity set by the control signal (mod n[5:0]) when a control signal (ld_on) from the microprocessor MPU is on the 'H' level. Subsequently, in the battery-less mode, the transmission block TXBK rectifies (and controls the voltages of) the power signals (tp and tm) from the antenna to generate the power supply voltage (vccrf) of, e.g., 2.7 V or the like and additionally boosts them to generate the power supply voltage (vccnwell) of, e.g., about 5 V. In the same manner as in the card mode, the transmission block TXBK also performs the load modulating operation in accordance with the control signal (ld_on) from the microprocessor MPU. Furthermore, the transmission block TXBK determines that the battery-less mode is set (i.e., external power is not supplied) and outputs a detection signal (bless).

Next, in the RFS mode, when the amplitudes of the reception signals (rxinp and rxinn) reach a given level or higher (i.e., when an input of a carrier is detected), the transmission block TXBK causes a detection signal (cdet) to fall. Sensitivity on the detection of a carrier is provided with a hysteresis characteristic. When the transmission block TXBK has caused the detection signal (cdet) to fall, it holds the 'L' level thereof for a period of, e.g., 100 to 500 µs. That is, the NFC chip according to the present embodiment is configured such that, in the card mode or battery-less mode, circuit blocks other than that for performing carrier detection are basically held in an inactive state for power saving and the individual circuit blocks are activated in response to carrier detection. Here, since ASK modulation has been performed, the detected carrier has the hysteresis characteristic described above or the function of retaining the level to prevent unneeded switching of the detection signal (cdet). Subsequently, in the clock extracting operation, the transmission block TXBK extracts the clock signal from the reception signal (rxinp). When the reception signal (rxinp) has no amplitude, the 'L' level is outputted.

<Detailed Configuration of (Entire) Transmission Block TXBK>

Figure 7:
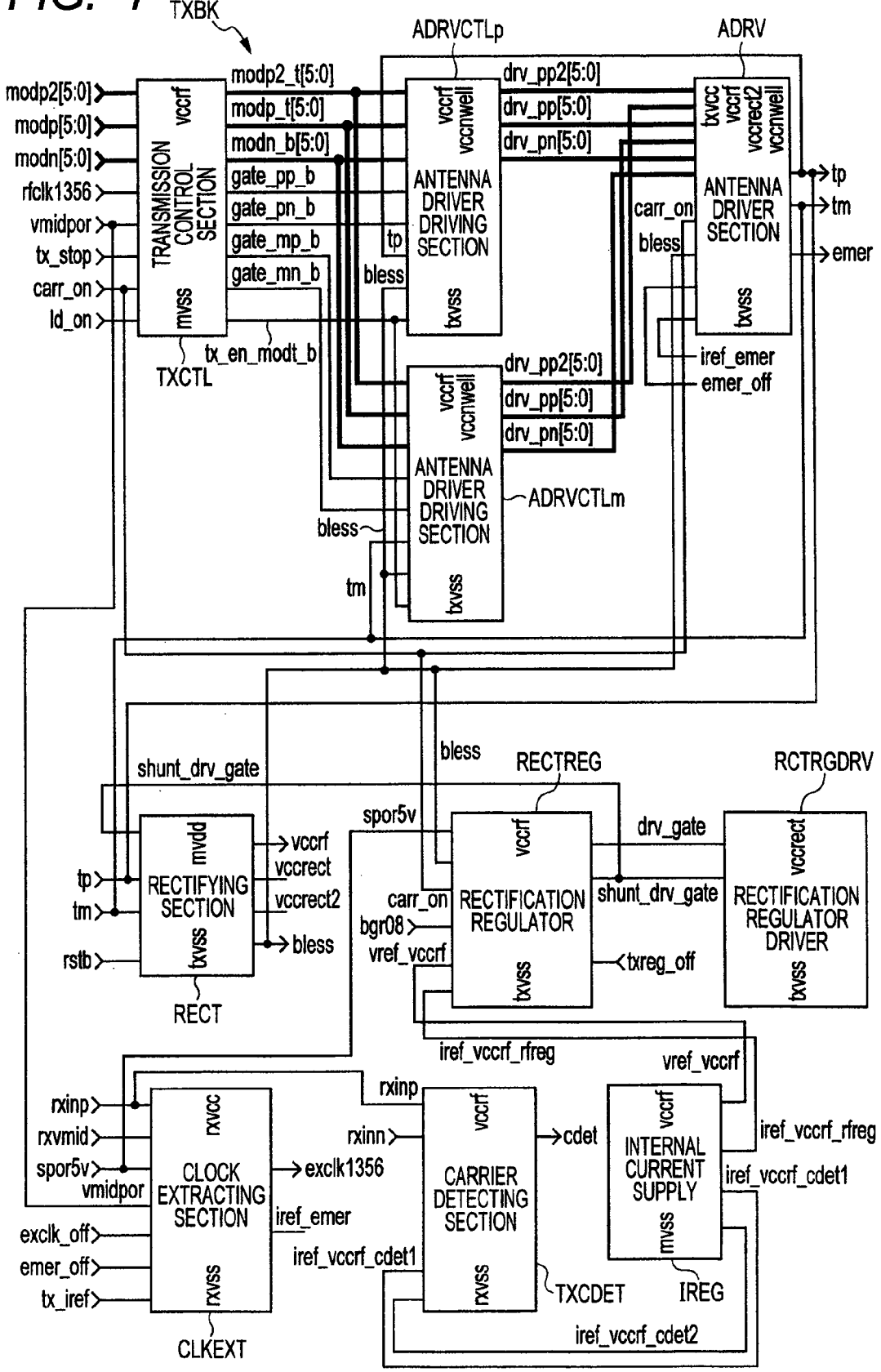
FIG. 7 is a block diagram showing, in the semiconductor device for wireless communication of FIG. 6, an example of a detailed configuration of a transmission block thereof.

FIG. 7 is block diagram showing, in the semiconductor device for wireless communication of FIG. 6, an example of a detailed configuration of the transmission block TXBK thereof. In FIG. 7, the antenna driver section ADRV is a block which drives the external antenna with the transmission signals (tp and tm) and includes the pull-up PMOS transistors, the pull-down NMOS transistors, and modulation percent correcting pull-down PMOS transistors. As described with reference to FIGS. 3 and 4, during the battery-less mode period, to prevent the parasitic PNP transistor of each of the pull-up PMOS transistors from inhibiting the rectifying operation, the antenna driver section ADRV also includes the switches for controlling the back bias. Also, during the RW mode period, the antenna driver section ADRV outputs the detection signal (emer) when an abnormal voltage has occurred at the external terminals (in the transmission signals (tp and tm)).

Antenna driver driving sections ADRVCTLp and ADRVCTLm drive the individual antenna driving MOS transistors in the antenna driver section ADRV described above. At this time, the number of the MOS transistors to be driven is controlled. In addition, to shape an output waveform from the antenna during the driving, a CR feedback circuit exists which retards a change in the gate potential of each of the MOS transistors in the antenna driver section ADRV. A transmission control section TXCTL mainly performs control of an antenna driving function. The transmission control section TXCTL also has the function of buffering a digital input signal. The rectifying section RECT rectifies a waveform inputted thereto from the antenna to generate the power supply voltages. The rectifying section RECT also includes a 2-stage voltage boosting circuit for generating the bulk voltage of each of the pull-up PMOS transistors in the antenna driver section ADRV. The rectifying section RECT further has the function of switching between the external power supply (mvdd) and the rectified power supply and the function of determining the battery-less mode.

The rectification regulator RECTREG drives the rectification regulator driver RCTRGDRV to control the magnitudes of the power supply voltages generated in the rectifying section RECT. Before the rectified power supply rises, the reference voltage (bgr08) from the reference generating circuit REFG of FIG. 6 does not rise so that the rectified power supply is raised with a reference voltage (vref_vccrf) from an internal current supply IREG. The rectification regulator driver RCTRGDRV receives an output from the rectification regulator RECTREG and extracts a current from the rectified power supply. The rectification regulator driver RCTRGDRV also limits an amplitude at each of the external terminals (in each of the signals (tp and tm)) and maximally extracts a current from the power supply voltage (vccrect) so as to prevent a reverse current flow from each of the external terminals (signals (tp and tm)).

A carrier detecting section TXCDET detects an amplitude that has occurred at the external terminal (reception signal rxinp or rxinn) during an RFS mode period. A detection signal is held for 100 to 500 μs. The detection of a carrier is not stopped even during another mode period. A clock extracting section CLKEXT extracts a clock from a signal inputted to the reception signal (rxinp) and outputs a clock signal (exclk1356). During a clock halt period, as the clock signal (exclk1356), the 'L' level is outputted. The internal current supply IREG supplies the reference current to the rectification regulator RECTREG and the carrier detecting section TXCDET. The internal current supply IREG also outputs, for the time when the rectified power supply rises, a low-accuracy reference voltage using a difference between the thresholds Vth of the MOS transistors.

<Detailed Configuration of Antenna Driver Section ADRV>

Figure 8:
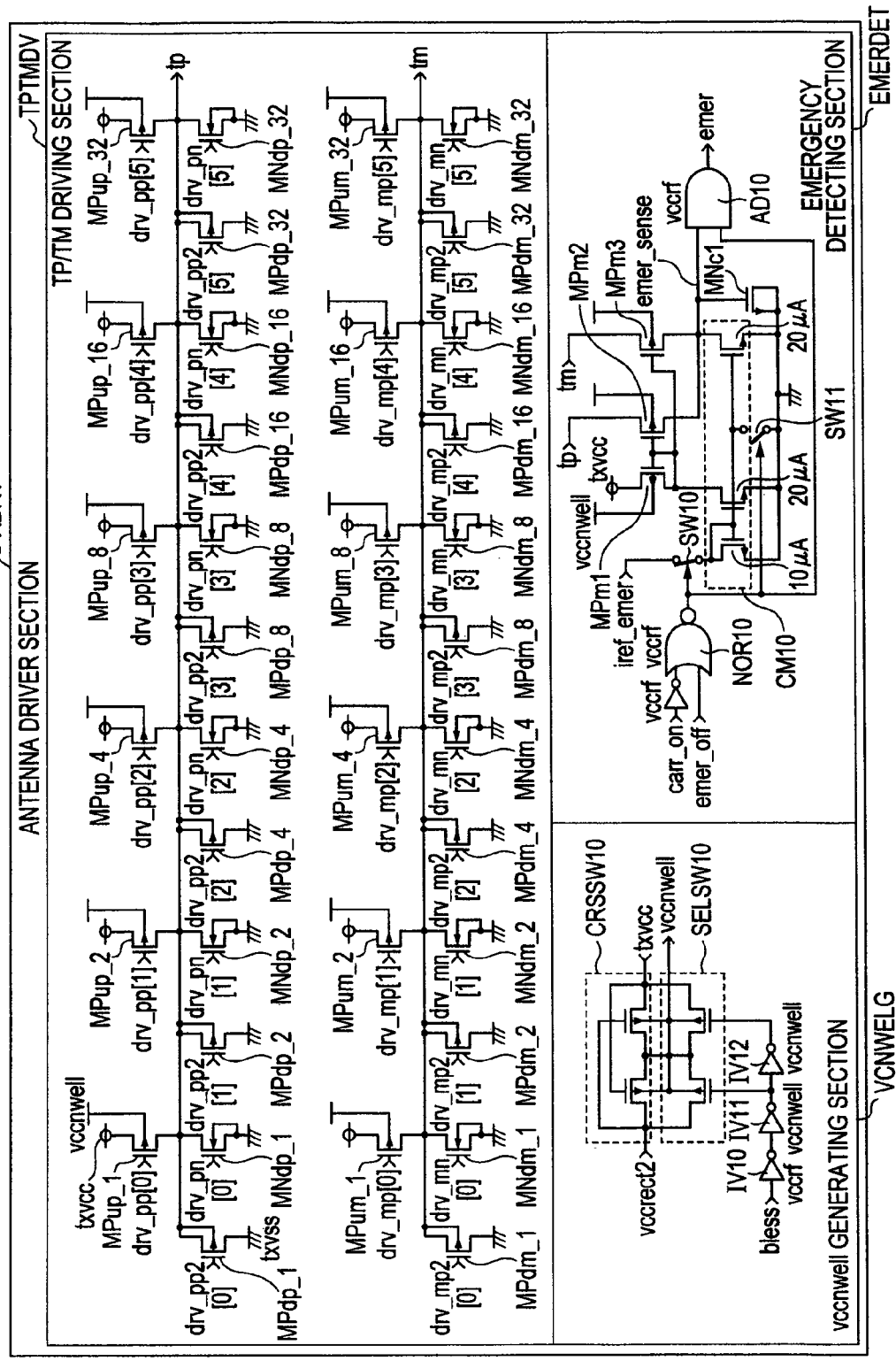
FIG. 8 is a circuit diagram showing, in the transmission block of FIG. 7, an example of a detailed configuration of an antenna driver section thereof.

FIG. 8 is a circuit diagram showing, in the transmission block TXBK of FIG. 7, an example of a detailed configuration of the antenna driver section ADRV thereof. The antenna driver section ADRV includes a TP/TM driving section TPTMDV, a vccnwell generating section VCNWELG, and an emergency detecting section EMERDET. The TP/TM driving section TPTMDV includes, for one of the external terminals (signal tp) as a driving target, six pull-up PMOS transistors MPup_x, six pull-down NMOS transistors MNdp_x, and six modulation percent correcting pull-down PMOS transistors MPdp_x. Here, "x" has a value of 1, 2, 4, 8, 16, or 32 and each of the MOS transistors has a driving force (i.e., transistor size ratio) corresponding to the value. The six pull-up PMOS transistors MPup_x are respectively driven by six drive signals (drv_pp[5:0]). The six pull-down NMOS transistors MNdp_x are respectively driven by six drive signals (drv_pn[5:0]). The six modulation percent correcting pull-down PMOS transistors MPdp_x are respectively driven by six drive signals (drv_pp2[5:0]). By switching the operation/non-operation of each of the drive signals, the driving forces of the pull-up PMOS transistors, the pull-down NMOS transistors, and the modulation percent correcting pull-down PMOS transistors can be adjusted to 64 stages.

Likewise, the TP/TM driving section TPTMDV includes, for the other external terminal (signal tm) as a driving target, six pull-up PMOS transistors MPum_x, six pull-down NMOS transistors MNdm_x, and six modulation percent correcting pull-down PMOS transistors MPdm_x. The six pull-up PMOS transistors MPum_x are respectively driven by six control signals (drv_mp[5:0]). The six pull-down NMOS transistors MNdm_x are respectively driven by six control signals (drv_nm[5:0]). The six modulation percent correcting pull-down PMOS transistors MPdm_x are respectively driven by six control signals (drv_mp2[5:0]). Here, detailed potentials at individual nodes in the pull-up PMOS transistors MPup_x and MPum_x and the pull-down NMOS transistors MNdp_x and MNdm_x are as shown in FIGS. 3 and 4. The modulation percent correcting pull-down PMOS transistors MPdp_x and MPdm_x are used to restrict a modulation percent to the range of 8.5 to 13.5% against PVT (Process, Voltage, and Temperature) variations during ASK modulation based on a "Type B" standard. Control methods for the individual signals will be described later.

In FIG. 8, the vccnwell generating section VCNWELG includes a cross switch circuit CRSSW10, a selection switch circuit SELSW10, and three inverter circuits IV10 to IV12. The cross switch circuit CRSSW10 includes two PMOS transistors having series-coupled source/drain regions, and the commonly coupled nodes thereof are coupled to the power supply voltage (vccnwell). As described above, the power supply voltage (vccnwell) is used for the gate voltage and bulk voltage of each of the pull-up PMOS transistors in the antenna driver section ADRV and the like. A node other than that for the power supply voltage (vccnwell) in one of the two PMOS transistors in the cross switch circuit CRSSW10 is cross-coupled to the gate of the other transistor so that the boosted power supply voltage (vccrect2) generated in the rectifying section RECT is compared with the external power supply voltage (txvcc) and the power supply voltage at a higher potential is outputted as the power supply voltage (vccnwell). Note that the back-bias of each of the two PMOS transistors is coupled to the power supply voltage (vccnwell).

The selection switch circuit SELSW10 includes two series-coupled PMOS transistors, and the commonly coupled nodes thereof are coupled to the power supply voltage (vccnwell), similarly to the cross switch circuit CRSSW10. The back bias of each of the two PMOS transistors is also coupled to the power supply voltage (vccnwell). The selection switch circuit SELSW10 simply selects either the external power supply voltage (txvcc) or the boosted power supply voltage (vccrect2) in accordance with the detection signal (bless) showing whether or not the battery-less mode is set and supplies a correct potential to the power supply voltage (vccnwell). At this time, the power supply potentials of the individual inverters IV10 to IV12 which drive the selection switch circuit SELSW10 are adjusted appropriately. FIG. 9 is a supplementary view of FIG. 8 and shows an example of potentials at the individual nodes in the vccnwell generating section VCNWELG.

Normally, during the battery-less mode period, the detection signal bless of 2.7 V is outputted. At this time, the required power supply voltage (vccnwell) is nearly equal to 5 V. To turn off the selection switch circuit SELSW10, a level shifter for achieving a shift from 2.7 V to 5.0 V is required. However, in consideration of the actual operation thereof, the inverter circuits IV10 to IV12 that can be implemented with circuits simpler than that of the level shifter are used instead. The inverter IV10 inversely drives, e.g., the detection signal (bless) on the 'H' level using the voltage (vccrf) as the power supply and outputs 0 V. On receiving the output inputted thereto, the inverter IV11 inversely drives the received output using the power supply voltage (vccnwell) and outputs a signal of, e.g., 5 V or the like. Normally, such a method does not result in successful operation of the selection switch circuit SELSW10 when the detection signal (bless) is on the 'L' level. However, when the detection signal (bless) is on the 'L' level (i.e., during another mode period other than the battery-less mode period), vccnwell=txvcc=3.0 V is satisfied. In this case, when the 'L' level of the detection signal (bless) is inverted in the inverter IV10 which performs driving with the power supply voltage (vccrf), an output potential satisfies vccrf=mvdd−0.1=txvcc−0.2=2.8 V (lowest value). When the potential of 2.8 V is inputted to the inverter IV11 which performs driving with the power supply voltage (vccnwell), the 'L' level can be outputted without any problem to allow the selection switch circuit SELSW10 to correctly operate.

Note that, in generating the power supply voltage (vccnwell), the two types of switch circuits (CRSSW10 and SELSW10) are provided for the following purposes. First, the cross switch circuit CRSSW10 is provided for the purpose of generating a correct potential for the power supply voltage (vccnwell) even if the power supply voltages (vccrf and vccrect2) have not completely risen for the reason of timing immediately after the activation of the rectifying section RECT or the like and the driving of the detection signal (bless) by the inverter circuits IV10 to IV12 using the voltages (vccrf and vccrect2) as the power supply is incomplete. In addition to the cross switch circuit CRSSW10, the selection switch circuit SELSW10 is provided for the purpose of ensuring higher security since, if, e.g., the power supply voltages (vccrect2 and txvcc) are at equal potentials for any reason, the PMOS transistors of the cross switch circuit CRSSW10 are each turned OFF.

In FIG. 8, the emergency detecting section EMERDET uses PMOS transistors the bulk voltage of each of which is the power supply voltage (vccnwell) so that the emergency detecting section EMERDET is provided in the antenna driver section ADRV. The emergency detecting section EMERDET is activated via a NOR circuit NOR10 when the control signal (carr_on) is on the 'H' level and a control signal (emer_off) is on the 'L' level. When the emergency detecting section EMERDET has been activated, a current mirror circuit CM10 supplies a bias current of 20 μA to a biasing PMOS transistor MPm1 using iref_emer=10 μA from the clock extracting section CLKEXT (FIG. 7) and, resultantly, the gates of emer detecting PMOS transistors MPm2 and MPm3 are biased.

Here, when the signals (tp and tm) exceed the voltage (txvcc), a gate-source voltage Vgs of each of the transistors MPm2 and MPm3 exceeds the gate-source voltage Vgs of the transistor MPm1 so that an excess current over 20 μA flows into each of the transistors MPm2 and MPm3. As a result, the potential of a signal (emer_sense) rises, an output of an AND circuit AD10 is inverted from the 'L' level to the 'H' level, and the detection signal (emer) is outputted. Note that, when the emergency detecting section EMERDET is not activated, the signal (emer_sense) is unstable but, since the 'L' level is inputted to one of the input terminals of the AND circuit AD10, there is no problem.

<Detailed Configuration of Antenna Driver Driving Section ADRVCTL>

Figure 10:
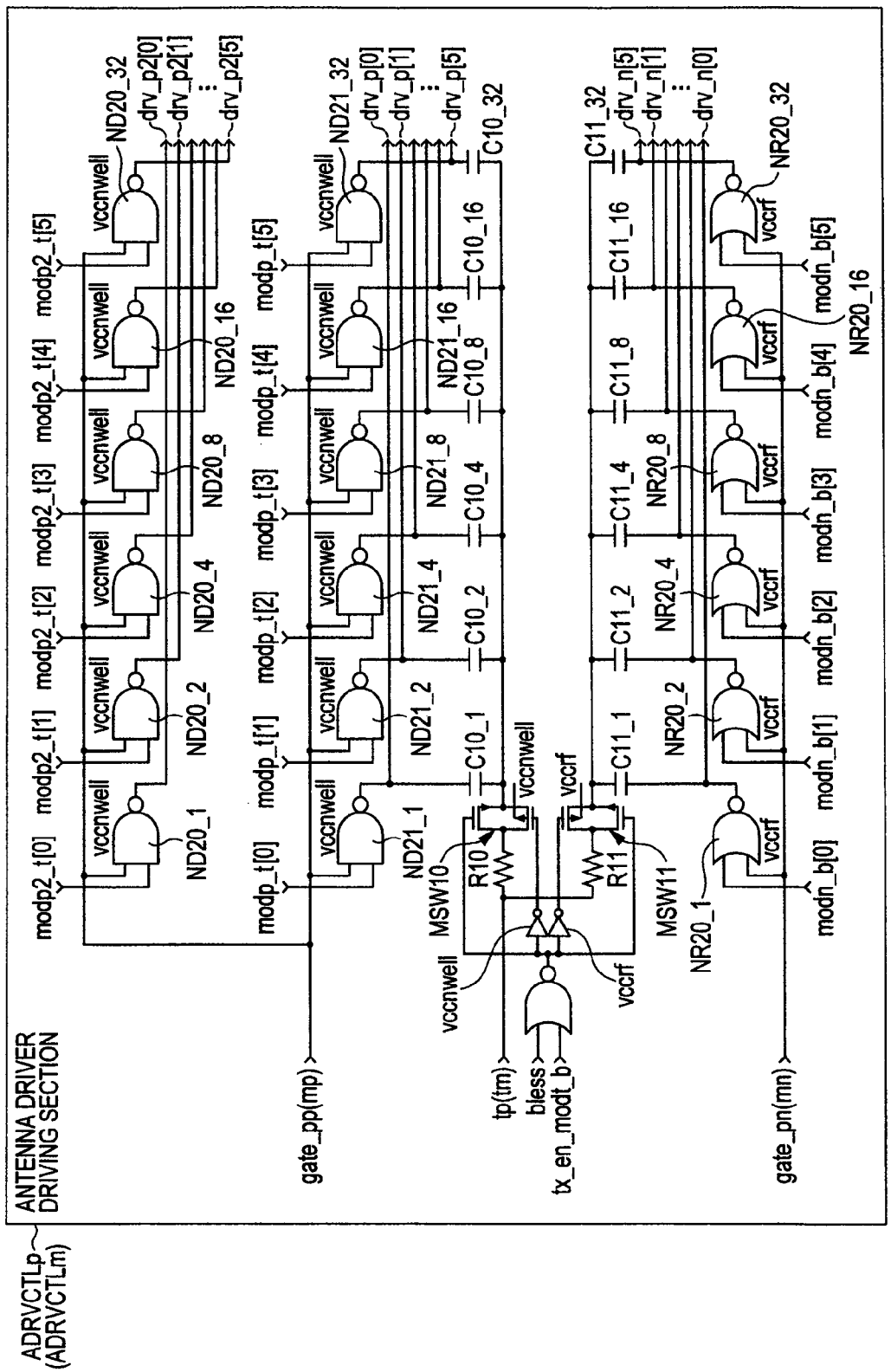
FIG. 10 is a circuit diagram showing, in the transmission block of FIG. 7, an example of a detailed configuration of an antenna driver driving section thereof.

FIG. 10 is a circuit diagram showing, in the transmission block TXBK of FIG. 7, an example of a detailed configuration of the antenna driver driving section ADRVCTL thereof. The antenna driver driving sections ADRVCTLp and ADRVCTLm are circuits which drive the individual antenna driving MOS transistors (pull-up, pull-down, and modulation percent correcting MOS transistors) in the antenna driver section ADRV described above and control the number of the MOS transistors to be driven. In FIG. 10, six NAND circuits ND20_x operate using the voltage (vccnwell) as the power supply and output signals (drv_p2[0] to drv_p2[5]), respectively. Here, "x" has a value of 1, 2, 4, 8, 16, or 32 and the driving force of each of the NAND circuits ND20_x is adjusted at a ratio corresponding to the value. The signals (drv_p2[0] to drv_p2[5]) serve as drive signals for the modulation percent correcting pull-down PMOS transistors. Note that, based on the correlation between FIGS. 10 and 8, the signals (drv_p2[0] to drv_p2[5]) correspond to signals (drv_pp2[0] to drv_pp2[5]) of FIG. 8 when FIG. 10 shows the antenna driver driving section ADRVCTLp or signals (drv_mp2[0] to drv_mp2[5]) of FIG. 8 when FIG. 10 shows the antenna driver driving section ADRVCTLm.

Likewise, six NAND circuits ND21_x operate using the voltage (vccnwell) as the power supply and output signals (drv_p[0] to drvp[5]), respectively. The signals (drv_p[0] to drv_p[5]) serve as drive signals for the pull-up PMOS transistors. Also, six NOR circuits NR20_x operate using the voltage (vccrf) as the power supply and output signals (drv_n[0] to drv_n[5]), respectively. The signals (drv_n[0] to drv_n[5]) serve as drive signals for the pull-down NMOS transistors. Here, to each of the drive signals directed toward the pull-up/pull-down MOS transistors, the CR feedback circuit for retarding a change in gate potential for shaping an output waveform (specifically for reducing a harmonic component) has been added.

For example, the drive signals (drv_p[0] to drv_p[5]) for the pull-up PMOS transistors are commonly coupled via respective capacitors C10_x (x satisfies x=1, 2, 4, 8, 16, or 32 and represents the ratio of a capacitive value), and the commonly coupled nodes thereof are coupled to the signal (tp or tm) via a switch circuit MSW10 and a resistor R10. That is, the signal (tp or tm) is fed back to the signals (drv_p[0] to drv_p[5]) via a CR circuit. Note that, in the modulation percent correcting MOS transistors, a potential change is not particularly retarded. The CR feedback circuit is turned OFF via switch circuits (MSW10 and MSW11) during a period other than a transmitting operation period in the RW mode to particularly prevent a situation such as the occurrence of a leakage current during the rectifying operation due to erroneous driving of each of the antenna driving MOS transistors.

Figure 11A:
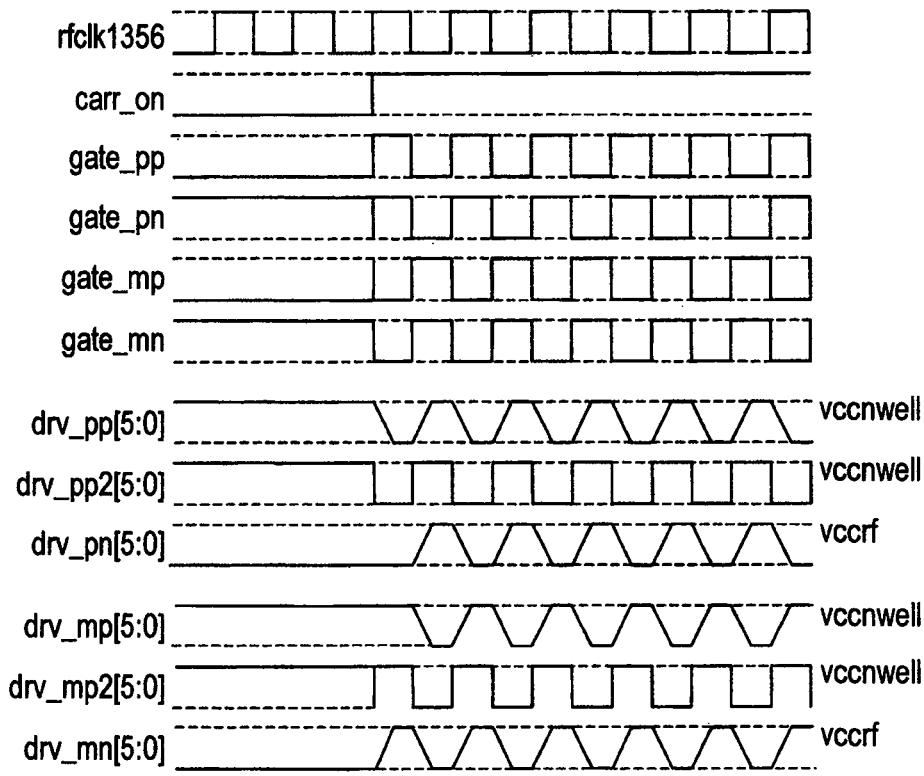
Figure 11B:
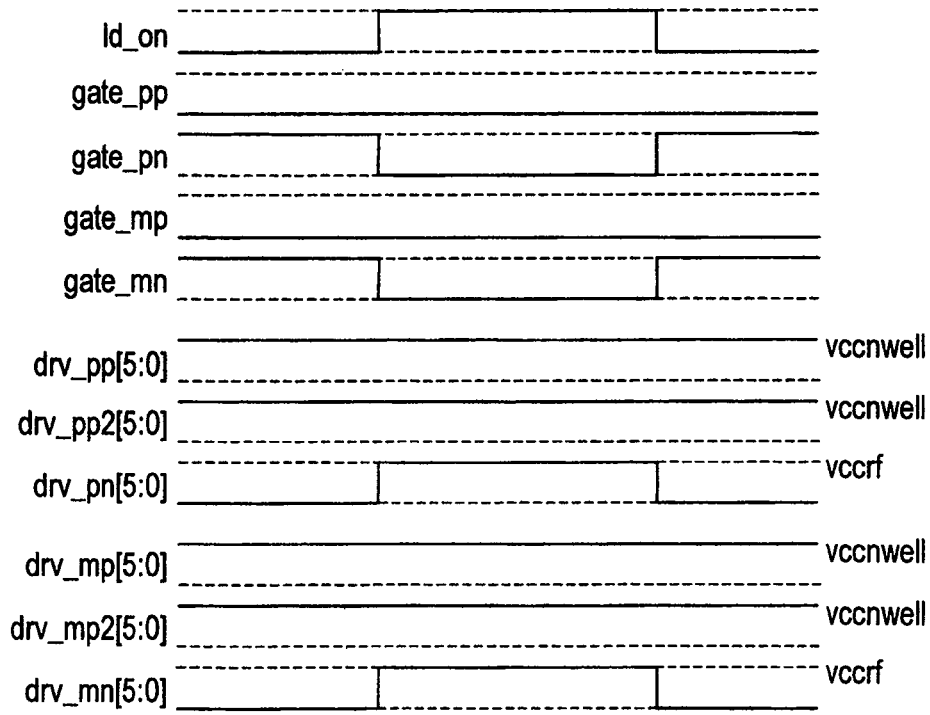

FIGS. 11(a) and 11(b) show an example of operation of the antenna driver driving section ADRVCTL of FIG. 10, of which FIG. 11(a) is a waveform chart during the RW mode period and FIG. 11(b) is a waveform chart during the card mode (battery-less mode) period. In FIG. 11(a), in the RW mode, the antenna driver driving section ADRVCTL drives the antenna mainly at 13.56 MHz to perform ASK modulation. During the RW mode period, vccnwell=txvcc≈vccrf is satisfied so that a mismatch between the power supply voltages does not present a problem. When the control signal (carr_on) is on the 'L' level, signals (gate_pp='L', gate_pn=vccrf, gate_mp='L', and gate_nm=vccrf) are outputted from the transmission control section TXCTL (FIG. 7). Therefore, each of the signals (drv_pp2(mp2)[5:0]) has the voltage (vccnwell), each of the signals (drv_pp(mp)[5:0]) has the voltage (vccnwell), and each of the signals (drv_pn (mn)[5:0]) outputs the 'L' level. As a result, each of the MOS transistors in the antenna driver section ADRV is brought into an OFF state and each of the signals (tp and tm) is brought into a high impedance state.

On the other hand, when the 'H' level is inputted to the signal (carr_on), signals (gate_pp, gate_pn, gate_mp, and gate_nm) are inputted as clocks at 13.56 MHz from the transmission control section TXCTL (FIG. 7). At this time, the signals (gate_pp and gate_pn) are in the same phase and, likewise, the signals (gate_mp and gate_nm) are also in the same phase. On the other hand, the signals (gate_pp and gate_mp or gate_pn and gate_nm) are in opposite phases. At this time, to signals (drv_pp(mp)[5:0]) each included in signals (mod p_t[5:0]) from the transmission control section TXCTL (FIG. 7) and corresponding to a bit to which the 'H' level is inputted, a clock is outputted, while signals (drv_pp (mp)[5:0]) each included in the signals (mod p_t[5:0]) and corresponding to a bit to which the 'L' level is inputted are each fixed to the voltage (vccnwell). Thus, according to the signals (mod p[5:0]) inputted from the microprocessor MPU of FIG. 6, the driving forces of the pull-up PMOS transistors are adjusted.

Likewise, to signals (drv_pp2(mp2)[5:0]) each included in signals (mod p2_t[5:0]) from the transmission control section TXCTL and corresponding to a bit to which the 'H' level is inputted, a clock is outputted, while signals (drv_pp2(mp2) [5:0]) each included in the signals (mod p2_t[5:0]) and corresponding to a bit to which the 'L' level is inputted are each fixed to the voltage (vccnwell). Thus, according to the signals (mod p2[5:0]) inputted from the microprocessor MPU, the driving forces of the modulation percent correcting pull-down PMOS transistors can be adjusted. Also, to signals (drv_pn(mn)[5:0]) each included in signals (mod n_b[5:0]) from the transmission control section TXCTL and corresponding to a bit to which the 'L' level is inputted, a clock is outputted, while signals (drv_pn(mn)[5:0]) each included in the signals (mod n_b[5:0]) and corresponding to a bit to which the 'H' level is inputted are each fixed to the 'L' level. Thus, according to the signals (mod n[5:0]) inputted from the microprocessor MPU, the driving forces of the pull-down NMOS transistors are adjusted. Note that, when a carrier is outputted, the feedback circuit formed of the CR circuit is enabled and the waveforms of the signals (drv_pp(mp) and drv_pn(mn)) are obtuse. During other operations, the rectifying operation is inhibited particularly during the battery-less mode period so that the feedback circuit is in the OFF state.

In FIG. 11(b), in the card mode, the antenna driver driving section ADRVCTL performs the load modulating operation mainly according to the load modulation control signal (ld_on). During the card mode period, vccnwell=txvcc≈vccrf is satisfied so that a mismatch between the power supply voltages does not present a problem. When Ld_on='L' is satisfied, in the same manner as when carr_on='L' is satisfied during the RW mode period, the signals (gate_pp='L', gate_pn=vccrf, gate_mp='L', and gate_nm=vccrf) are outputted from the transmission control section TXCTL (FIG. 7). Therefore, each of the signals (drv_pp2(mp2)[5:0]) has the voltage (vccnwell), each of the signals (drv_pp(mp)[5:0]) has the voltage (vccnwell), and each of the signals (drv_pn (mn)[5:0]) is on the 'L' level. As a result, each of the MOS transistors in the antenna driver section ADRV is brought into the OFF state and each of the signals (tp and tm) is brought into the high-impedance state.

On the other hand, when the signal (ld_on='H') is inputted from the microprocessor MPU of FIG. 6, each of the signals (gate_pn and gate_nm) shifts to the 'L' level. Accordingly, to signals (drv_n[5:0]) each included in the signals (mod n_b[5: 0]) and corresponding to a bit to which the 'L' level has been inputted, the voltage (vccrf) is outputted, while signals (drv_n [5:0]) each included in the signals (mod n_b[5:0]) and corresponding to a bit to which the 'H' level has been inputted are each fixed to the 'L' level. As a result, with the driving forces according to the signals (mod n[5:0]) inputted from the microprocessor MPU, the pull-down NMOS transistors of the antenna driver section ADRV are turned ON and the load modulating operation according to the signal (ld_on) is performed. At this time, since each of the signals (gate_pp and gate_mp) remains on the 'L' level irrespective of the signal (ld_on), each of the signals (drv_pp(mp)[5:0] and drv_pp2 (mp2)[5:0]) is fixed to the voltage (vccnwell) so that the pull-up PMOS transistors and the modulation percent correcting pull-down PMOS transistors in the antenna driver section ADRV remain in the OFF state.

In the battery-less mode, basically only the load modulating operation is performed so that the operation is not different from the operation during the card mode period described above. The operation is different only in the settings of the power supply voltage, and vccnwell≈5 V is satisfied so that a mismatch between the power supply voltages occurs in regard to the amplitude of the input signal at the voltage (vccrf). However, as shown in FIG. 11(b), the level of each of the signals (gate_pp and gate_mp) is constantly fixed to satisfy gate_pp, gate_mp='L' so that the signals present no problem in response to a change in power supply voltage. The signals (mod p_t[5:0] and mod p2_t[5:0]) may be either on the 'H' level or the 'L' level but, as long as gate_pp, gate_mp='L' are satisfied, there is no flow of a through current to the NAND circuits ND20_x and ND21_x (x=1, 2, 4, 8, 16, or 32) so that no problem arises. However, it is safer, by way of caution, to set each of the signals (mod p_t[5:0] and mod p2_[5:0]) to the 'L' level.

<Detailed Configuration of Transmission Control Section TXCTL>

Figure 12:
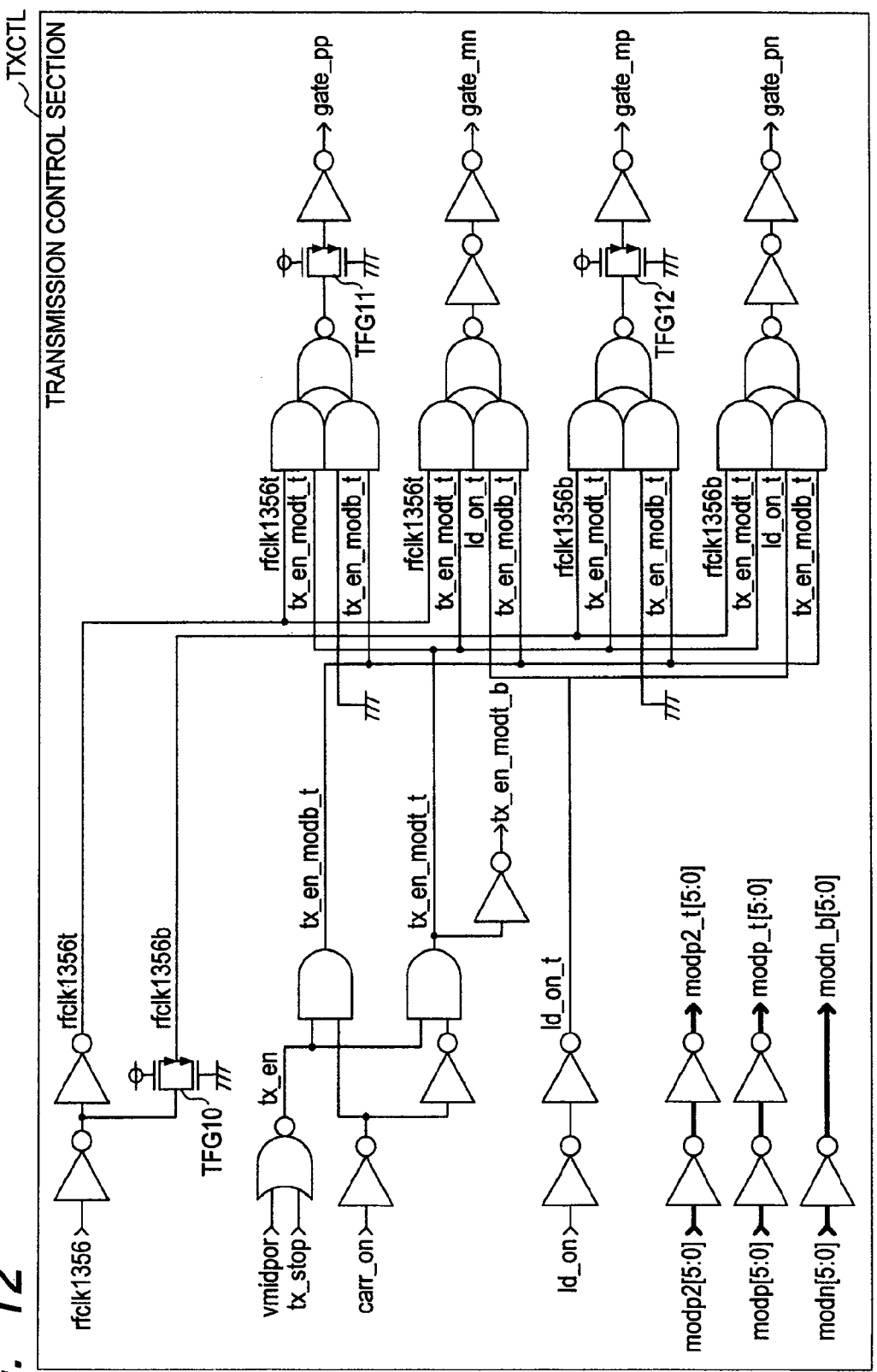
FIG. 12 is a circuit diagram showing, in the transmission block of FIG. 7, an example of a detailed configuration of a transmission control section thereof.

FIG. 12 is a circuit diagram showing, in the transmission block TXBK of FIG. 7, an example of a detailed configuration of the transmission control section TXCTL thereof. The transmission block TXBK receives various control signals mainly from the microprocessor MPU of FIG. 6 and performs control of the antenna driving function. The transmission block TXBK also has the function of buffering a digital input signal. In FIG. 12, when a signal (vmidpor or tx_stop) is on the 'H' level, the transmission block TXBK does not perform the transmitting operation (tx_en='L'). On the other hand, when tx_en='H' and carr_on='H' are satisfied, tx_en_mod_t_t='H' is satisfied so that signals (rfclk1356t and rfclk11356b) are enabled and a clock is outputted to the signal (gate_pp(mn, mp, and pn)). The phases of the signals (rfclk1356t and rfclk1356b) are matched using a transfer gate TFG10, and the phases of the signals (gate_pp(mn, mp, and pn)) are also matched using transfer gates TFG11 and TFG12.

When tx_en='L' is satisfied, the signal (gate_pp(mp)) is fixed to the 'H' level and the signal (gate_pn(mn)) is fixed to the 'L' level. When tx_en_mod t_t='H' is satisfied, positive/ negative pole signals (true/bar) are used appropriately such that clocks outputted to the signals (gate_pp and gate_pn) are in the same phase, clocks outputted to the signals (gate_mp and gate_nm) are also in the same phase, and clocks outputted to the signals (gate_pp and gate_mp) are in opposite phases. On the other hand, when tx_en='H' and carr_on='L' are satisfied, tx_en_mod b_t='H' is satisfied so that the signal (ld_on) is enabled and outputted to the signal (gate_pn(mn)). At this time, the signal (gate_pp(mp)) is fixed to the 'H' level. The signals (mod p2[5:0], mod p[5:0], and mod n[5:0]) are each buffered in consideration of the positive/negative pole signals (true/bar) and outputted as the signals (mod p2_t[5:0], mod p_t[5:0], and mod n_b[5:0]).

<Detailed Configuration of Rectifying Section RECT>

Figure 13:
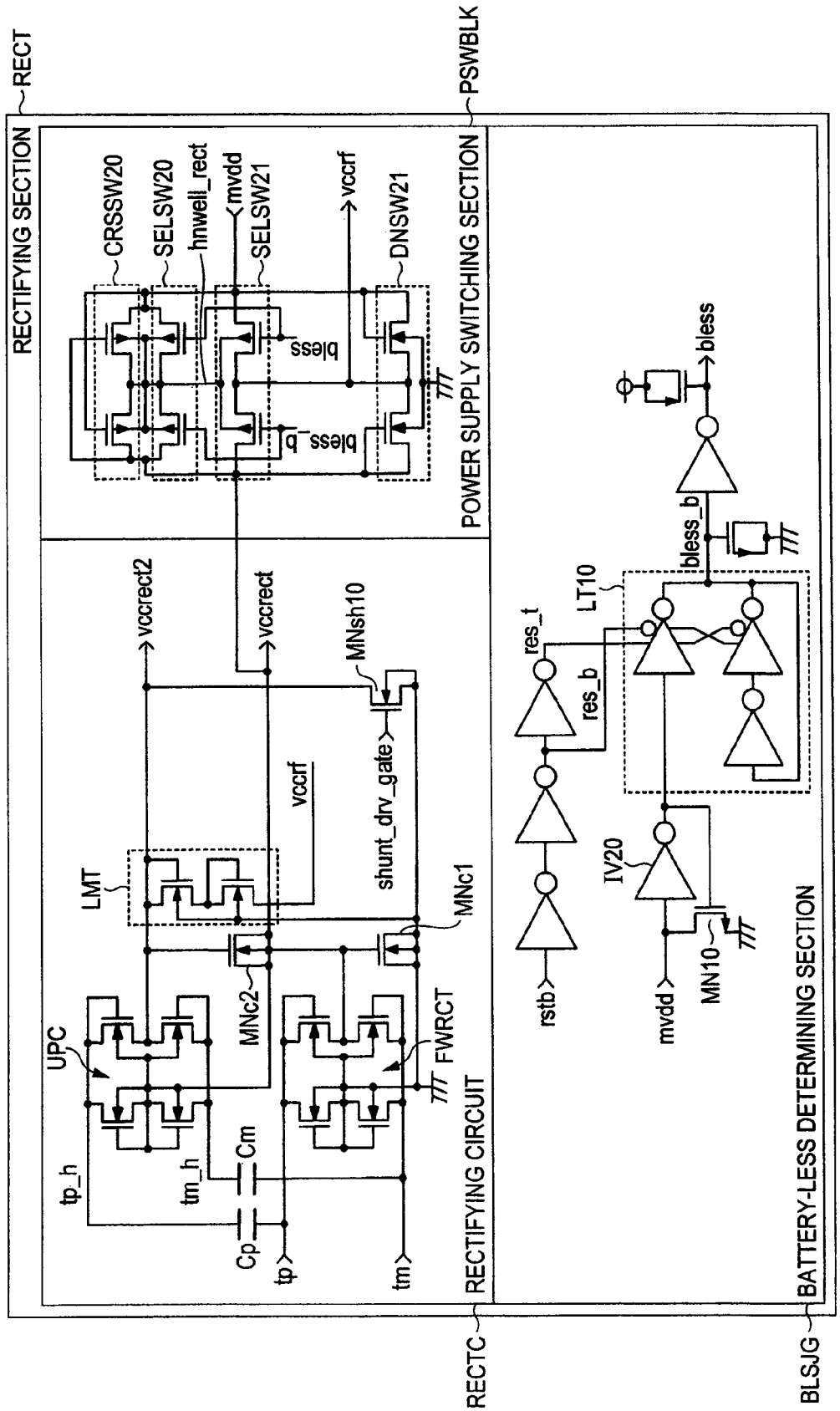
FIG. 13 is a circuit diagram showing, in the transmission block of FIG. 7, an example of a detailed configuration of the rectifying section thereof.

FIG. 13 is a circuit diagram showing, in the transmission block TXBK of FIG. 7, an example of a detailed configuration of the rectifying section RECT thereof. The rectifying section RECT includes a rectifying circuit RECTC, a power supply switching section PSWBK, and a battery-less determining section BLSJG. The rectifying circuit RECTC is mainly formed of the first-stage full-wave rectifying circuit FWRCT which generates the power supply voltage (vccrect) as a rectified voltage output and the second-stage voltage boosting circuit UPC which generates the power supply voltage (vccrect2) as a boosted voltage. The full-wave rectifying circuit FWRCT is formed of a diode bridge including four diode-coupled NMOS transistors.

The two input nodes of the diode bridge are coupled to the respective signals (tp and tm), while one of the two output nodes thereof is coupled to the ground power supply voltage and, from the other of the two output nodes thereof, a signal obtained through full-wave rectification of the signals (tp and tm) is outputted. During the battery-less mode period, the signal from the output node is smoothed with a MOS capacitor formed of an NMOS transistor MNc1 coupled between the voltage (vccrect) and the ground power supply voltage so that the power supply voltage (vccrect) is generated. Note that each of the NMOS transistors forming the diode bridge has low threshold voltage specifications. On the other hand, during the card mode period and the RW mode period when a carrier is not outputted, the voltage (vccrect) from the full-wave rectifying circuit FWRCT is fixed to the 'L' level by the functions of the rectification regulator RECTREG and the rectification regulator driver RCTRGDRV, which will be described later. As a result, the rectifying circuit RECTC operates as a shunt circuit which limits the amplitudes of the signals (tp and tm).

The second-stage voltage boosting circuit UPC is formed of a diode bridge including four NMOS transistors having low threshold voltage specifications, similarly to the full-wave rectifying circuit FWRCT, performs full-wave rectification of signals (tp_h and tm_h) inputted from the signals (tp and tm) via the capacitors Cp and Cm, and stores the output thereof in a capacitor formed of an NMOS transistor MNc2. In the voltage boosting circuit UPC, one of the two output nodes and one terminal of the capacitor (MNc2) are coupled to the voltage (vccrect). This allows the voltage boosting circuit UPC to generate the power supply voltage (vccrect2) one level higher than the voltage (vccrect). Note that the configuration including the full-wave rectifying circuit FWRCT, the voltage boosting circuit UPC, and the various capacitors (Cp, Cm, MNc1, and MNc2) can also be regarded as a configuration which drives a Dickson-type charge pump circuit with both of the signals (true/bar). The voltage (vccrect2) is used as the bulk voltage of each of the pull-up PMOS transistors in the antenna driver section ADRV during the battery-less mode period or the like.

Also, the rectifying circuit RECTC includes a limit circuit LMT for preventing the voltage (vccrect2) from reaching a breakdown voltage. The limit circuit LMT limits the voltage (vccrect2) to a potential corresponding to two NMOS transistor stages from the voltage (vccrf). The rectifying circuit RECTC also includes a shunt NMOS transistor MNsh10 for also fixing the voltage (vccrect2) to the 'L' level when the rectifying circuit RECTC operates as the shunt circuit, as described above. The shunt NMOS transistor MNsh10 extracts a current from the voltage (vccrect2) to the ground power supply voltage when shunt_drv_gate='H' is satisfied.

The power supply switching section PSWBK generates the power supply voltage (vccrf). The power supply switching section PSWBK generates the power supply voltage (vccrf) from the voltage (vccrect) in the battery-less mode or from the external power supply voltage (mvdd) in another mode other than the battery-less mode. The power supply switching section PSWBK includes selection switch circuits SELSW20 and SELSW21, a cross switch circuit CRSSW20, and an NMOS diode switch circuit DNSW21. The selection switch circuit SELSW21 is a main switch including two series-coupled PMOS transistors, and the commonly coupled nodes thereof are coupled to the voltage (vccrf). The selection switch circuit SELSW21 controls one of the PMOS transistors into an ON state based on the result of the determination by the battery-less determining section BLSJG and couples the voltage (vccrf) to the voltage (vccrect) or the voltage (mvdd).

Here, when the potential of the voltage (vccrf) is low, the battery-less determining section BLSJG may not operate properly and the selection switch circuit SELSW21 may not be able to precisely operate. To prevent this (to cause the voltage (vccrf) to promptly rise), the NMOS diode switch circuit DNSW21 is provided. The NMOS diode switch circuit DNSW21 includes two series-coupled NMOS transistors, and the commonly coupled nodes thereof are coupled to the voltage (vccrf). Each of the NMOS transistors has low threshold voltage specifications and is diode-coupled such that each of the vccrect side and mvdd side thereof serves as an anode. When the voltage (vccrf) approaches the potential of the voltage (vccrect) or the voltage (mvdd), the current driving force of the NMOS diode switch circuit DNSW21 decreases but, around that time, the battery-less determining section BLSJG operates and the selection switch circuit SELSW21 operates so that there is no problem.

A further problem encountered in operating the selection switch circuit SELSW21 is the bulk (nwell) potential of the PMOS transistor in the selection switch circuit SELSW21. To solve the problem, in the same manner as in the cross switch circuit CRSSW10 shown in FIG. 8, the cross switch circuit CRSSW20 of FIG. 13 uses a higher one of the voltage (vccrect) and the voltage (mvdd) as a power supply voltage (hnwell_rect) and supplies the power supply voltage (hnwell_rect) to the bulk voltage in the selection switch circuit SELSW21. Furthermore, the selection switch circuit SELSW20 uses either the voltage (vccrect) or the voltage (mvdd) as the power supply voltage (hnwell_rect) and supplies the power supply voltage (hnwell_rect) to the bulk voltage in the selection switch circuit SELSW21.

The battery-less determining section BLSJG is formed of circuits each using the voltage (vccrf) as the power supply. The battery-less determining section BLSJG checks the potential of the external power supply voltage (mvdd) upon activation and determines whether or not the battery-less mode is set. During the battery-less mode period, the voltage (mvdd) should have fallen to the 'L' level and, when the voltage (mvdd) is on the 'L' level, it is determined from the logic threshold of the inverter circuit IV20 that the battery-less mode is set. The result of the determination by the inverter circuit IV20 is latched by a latch circuit LT10 through a shift of an inverted reset signal (rstb) to the 'H' level and retained thereafter until the inverted reset signal (rstb) falls to the 'L' level. However, during the period since the inverter circuit IV20 determines that the battery-less mode is set until the inverted reset signal (rstb) rises, a leakage current may occur successively in the voltages (vccrect, vccrf, and mvdd) to invert the result of the determination. Accordingly, an NMOS transistor MN10 which is turned ON when it is determined that the battery-less mode is set is provided to extract a weak current from the voltage (mvdd).

<Detailed Configuration of Rectification Regulator RECTREG and Rectification Regulator Driver RCTRGDRV>

Figure 14:
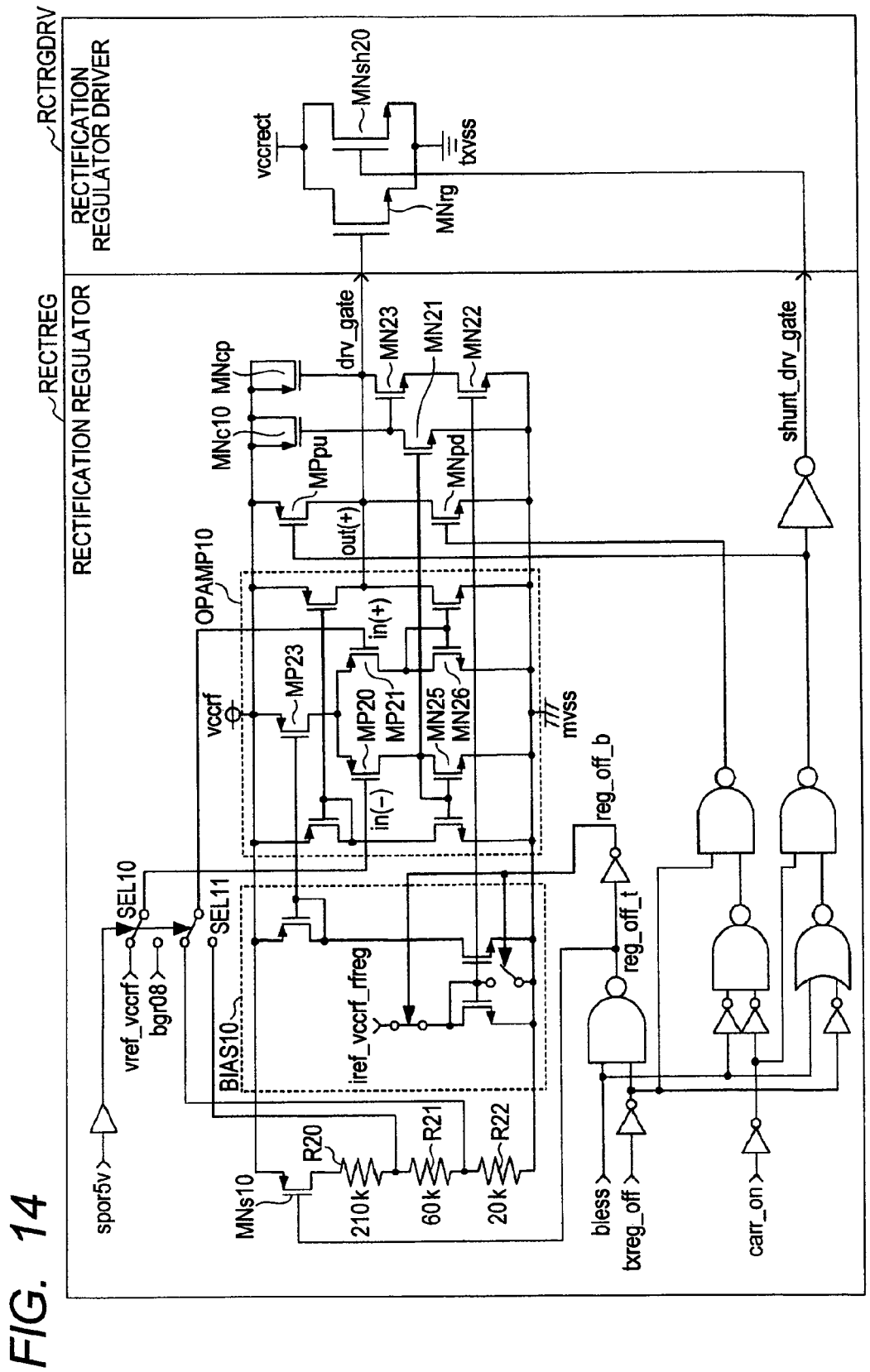
FIG. 14 is a circuit diagram showing, in the transmission block of FIG. 7, an example of detailed configurations of a rectification regulator and a rectification regulator driver thereof.

FIG. 14 is a circuit diagram showing, in the transmission block TXBK of FIG. 7, an example of detailed configurations of the rectification regulator RECTREG and the rectification regulator driver RCTRGDRV. The rectification regulator RECTREG drives the rectification regulator driver RCTRGDRV in order to control the value of the power supply voltage generated in the rectifying section RECT. The rectification regulator driver RCTRGDRV receives an output from the rectification regulator RECTREG and extracts a current from the rectified power supply (vccrect). Note that, before the rectified power supply rises, the reference voltage (bgr08) from the reference generating circuit REFG of FIG. 6 does not rise. Therefore, the rectification regulator RECTREG raises the rectified power supply using the reference voltage (vref_vccrf) from the internal current supply IREG of FIG. 7.

Also, to limit the amplitudes at the external terminals (of the signals (tp and tm)) during the card mode period and prevent a reverse current flow from each of the signals (tp and tm), the rectification regulator driver RCTRGDRV maximally extracts a current from the voltage (vccrect). That is, during the card mode period, it is desired to maximally limit the amplitudes at the transmission-system external terminals (of the signals (tp and tm)) so as not to affect, e.g., a reception-system operation. However, if the amplitudes are excessively limited, transmission toward the external reader/writer RW becomes difficult. Therefore, here, the current is maximally extracted from the voltage (vccrect) to thereby cause the rectifying circuit RECTC of FIG. 13 to operate as a shunt circuit and limit the amplitudes at the external terminals (of the signals (tp and tm)) to a range of those of forward voltages in the diode bridge.

As shown in FIG. 14, the rectification regulator RECTREG is basically a simple shunt regulator including the operational amplifier circuit OPAMP10. The operational amplifier circuit OPAMP10 includes a differential pair of PMOS transistors MP20 and MP21, a PMOS transistor MP23 serving as a tail current supply, NMOS transistors MN25 and MN26 each serving as a load transistor, and the like. The operational amplifier circuit OPAMP10 senses the power supply voltage (vccrf) thereof with a voltage dividing resistor including registers R20 to R22 and compares the power supply voltage with the reference voltage (bgr08) (e.g., 800 mV) to generate a control signal (drv_gate). If the voltage (vccrf) has a potential higher than 2.7 V, the potential of the signal (drv_gate) becomes higher and, in response to this, the rectification regulator driver RCTRGDRV extracts a larger amount of current from the power supply voltage (vccrect) via the NMOS transistor MNrg toward the ground power supply voltage (txvss). Conversely, if the voltage (vccrf) has a potential lower than 2.7 V, the potential of the signal (drv_gate) becomes lower and, in response to this, the rectification regulator driver RCTRGDRV reduces the current extracted from the power supply voltage (vccrect) via the NMOS transistor MNrg.

Here, the reason for the extraction of the current from the voltage (vccrect), not directly from the voltage (vccrf) is that, as described with reference to FIG. 3, since a switch circuit (such as the selection switch circuit SELSW21 in the power supply switching section PSWBK of FIG. 13) coupling the voltages (vccrect and vccrf) to each other has a resistance, even when input power from the antenna significantly varies due to 100% ASK or the like, an amount of variation in voltage (vccrf) can be suppressed. The reason for the flow of the current not to the voltage (mvss) (for the general transmission block), but to the voltage (txvss) (mainly for the antenna driver section) in the rectification regulator driver RCTRGDRV is that, since it is necessary to cause a current of not less than 200 mA at a maximum to flow, the current should flow to a terminal (txvss) which is unlikely to affect another circuit and capable of allowing a large current to flow. Since the rectification regulator RECTREG and the rectification regulator driver RCTRGDRV do not have a current mirror configuration, even when the potentials of the ground power supplies are different, no problem arises.

Also, as shown in FIG. 14, a MOS capacitor formed of an NMOS transistor MNcp is used for phase compensation to thereby achieve an area reduction. When FIG. 14 is viewed, it seems that dominant-pole compensation is performed but, when the signal (drv_gate) increases, a current extracted from the voltage (vccrect) increases and the voltage (vccrf) drops. Accordingly, drv_gate→vccrf involves a gain so that mirror compensation is performed and the size of the MOS capacitor is minimized. Mirror compensation in a typical series regulator is likely to allow introduction of RF noise from a power supply so that a PSRR (Power Supply Rejection Ratio) deteriorates. However, such a configuration results in successive occurrence of a drop in voltage (vccrect), a drop in signal (drv_gate) due to capacitor coupling, reduction in extracted current, and a rise in voltage (vccrf) and thus also functions as a speed-up capacitor so that the power supply voltage rejection ratio PSRR is improved.

Furthermore, since the voltage (vccrf) and the signal (drv_gate) are capacitor-coupled, even before the operational amplifier circuit OPAMP10 is completely activated on a rising edge of the voltage (vccrf), it is possible to raise the signal (drv_gate) and also suppress a rapid rise on the rising edge of the voltage (vccrf). Thus, using a phase compensation capacitor, the rapid rise of the voltage (vccrf) can be suppressed but, on the contrary, the rise of the voltage (vccrf) tends to slow. In particular, it is necessary to avoid a deadlock in which the voltage (vccrf) is low, the operational amplifier circuit OPAMP10 is not activated, the signal (drv_gate) does not operate, and the voltage (vccrf) remains low. Accordingly, the rectification regulator RECTREG includes a start-up circuit including MOS transistors MN21 to MN23.

Figure 15:
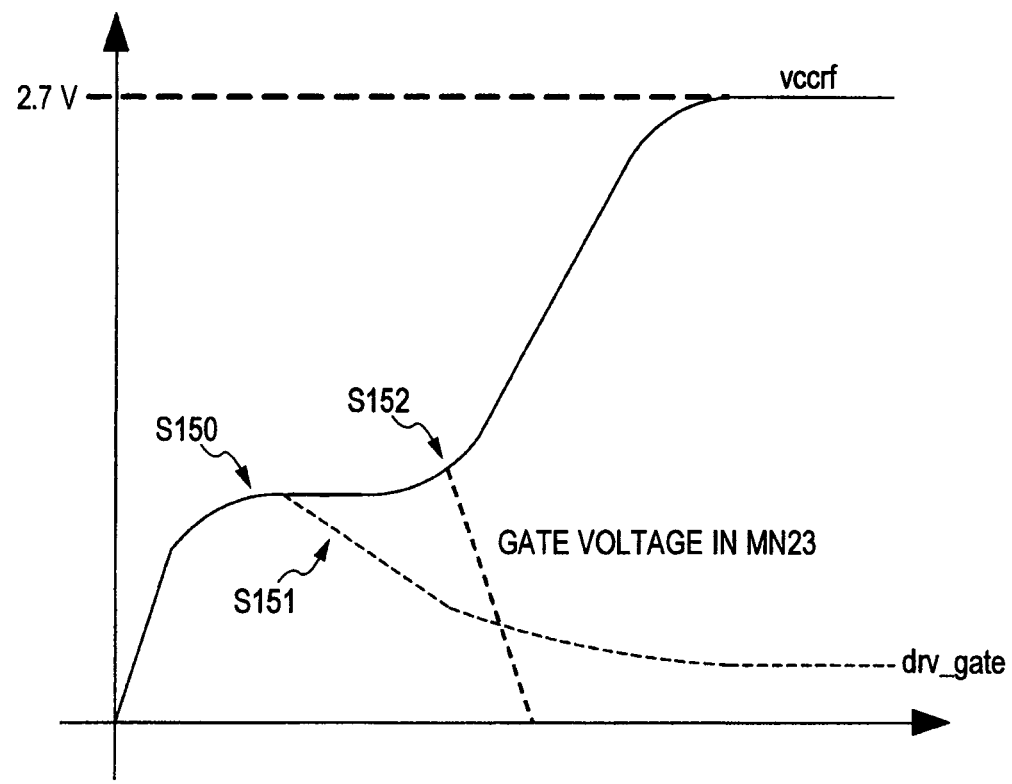
FIG. 15 is an illustrative view showing an example of operation of a start-up circuit in the rectification regulator of FIG. 14.

FIG. 15 is an illustrative view showing an example of operation of the start-up circuit in the rectification regulator of FIG. 14. At the start-up time, when power is inputted to the signals (tp and tm), the voltage (vccrf) rises to be stabilized at a potential corresponding to the current driving force of the rectification regulator driver RCTRGDRV (S150). At this time, the signal (drv_gate) is coupled to the voltage (vccrf) so that the potential thereof is substantially equal to that of the voltage (vccrf). At this time, since a current does not flow in the MOS transistor MN25 in the operational amplifier circuit OPAMP10 irrespective of the presence or absence of the operation of the operational amplifier circuit OPAMP10, a current does not flow also in the start-up MOS transistor MN21 forming the current mirror circuit therewith. As a result, the gate of the start-up MOS transistor MN23 remains capacitor-coupled to have a potential substantially equal to that of the voltage (vccrf).

On the other hand, the internal current supply IREG of FIG. 7 is configured to be activated even with an extremely low voltage, as will be described later in detail. Accordingly, the start-up MOS transistor MN22 current-mirrors a reference current (iref_vccrf_rfreg) from the internal current supply IREG via a bias circuit BIAS10 to thereby allow a current to flow therein and extracts a current from the signal (drv_gate) through the start-up MOS transistor MN23. Through the extraction of the current from the signal (drv_gate), the potential of the signal (drv_gate) drops and the voltage (vccrf) begins to rise (S151). When the voltage (vccrf) has sufficiently risen and entered a region where the control of the operational amplifier circuit OPAMP10 is performed, a current flows to each of the MOS transistor MN25 and the start-up MOS transistor MN21 in the operational amplifier circuit OPAMP10, and the current is extracted from the gate of the start-up MOS transistor MN23 (S152). After the gate voltage of the MOS transistor MN23 has sufficiently dropped, the start-up circuit is inactivated and does not interrupt the operation of the operational amplifier circuit OPAMP10.

In the NFC chip according to the present embodiment, after the voltage (vccrf) has risen, the reference voltage (bgr08) from the reference generating circuit REFG of FIG. 6 rises so that it is necessary to raise the voltage (vccrf) in a state where there is no reference voltage. Therefore, the reference voltage (vref_vccrf) using a difference between the thresholds Vth of the MOS transistors is generated in the internal current supply IREG and, using the reference voltage (vref_vccrf), the voltage (vccrf) is raised. In the state where a control signal (spor5v) from the microprocessor MPU of FIG. 6 is on the 'H' level, the comparison voltage of the operational amplifier circuit OPAMP10 is set to the voltage (vref_vccrf) by the selection circuit SEL10. Since the voltage (vref_vccrf) is about 200 mV, the resistance-divided value can also be simultaneously switched using the selection circuit SEL11. Thereafter, when the control signal (spor5v) shifts to the 'L' level, the reference voltage (bgr08) is selected as the comparison voltage of the operational amplifier circuit OPAMP10 and the resistance-divided value is switched, while the voltage (vccrf) is controlled using the voltage (bgr08) as a reference.

As has been described with respect to the rectifying section RECT of FIG. 13, during the card mode period or the RW mode period and when a carrier is not outputted, the voltage (vccrect) is fixed to the 'L' level and the rectifying circuit RECTC operates as the shunt circuit for the signals (tp and tm). Conversely, during the RW mode period and when a carrier is outputted, the voltage (vccrect) is brought into the high impedance state to bring the rectifying circuit RECTC into the OFF state as described with reference to FIG. 1 and not to inhibit the outputting of the carrier (i.e., to prevent transmission power leakage). Accordingly, the rectification regulator RECTREG is configured to include a PMOS transistor MPpu for pulling up the signal (drv_gate) and an NMOS transistor MNpd for pulling down the signal (drv_gate) and, using a logic circuit section, appropriately switch the ON/OFF states of the MOS transistors. FIG. 16 is a truth table showing, in the rectification regulator RECTREG of FIG. 14, an example of operation of the logic circuit section thereof.

In FIG. 16, when a control signal (txreg_off) from the microprocessor MPU of FIG. 6 is on the 'H' level, the operational amplifier circuit OPAMP10 stops its operation, and the signal (drv_gate) is pulled up. When txreg_off='L' is satisfied and the detection signal (bless) from the battery-less determining section BLSJG of FIG. 13 is on the 'H' level, the operational amplifier circuit OPAMP10 operates and the signal (drv_gate) is not pulled up/down. When txreg_off='L' and bless='L' are satisfied and the control signal (carr_on) from the microprocessor MPU of FIG. 6 is on the 'H' level (i.e., when a carrier is outputted in the RW mode), the operational amplifier circuit OPAMP10 stops its operation and the signal (drv_gate) is pulled down. As a result, the voltage (vccrect) is brought into the high impedance state. When texreg_off='L', bless='L', and carr_on='L' are satisfied (i.e., when a carrier is not outputted in the card mode or the RW mode), the operational amplifier circuit OPAMP10 stops its operation and the signal (drv_gate) is pulled up.

When the signal (drv_gate) is pulled up, a signal (shunt_drv_gate) is on the 'H' level and the voltage (vccrect) is fixed to the 'L' level with a stronger driving force in addition to the voltage (vccrf). That is, in the rectification regulator driver RCTRGDRV, a shunt NMOS transistor MNsh20 is provided in parallel with the NMOS transistor MNrg and driven with the signal (shunt_drv_gate). This is because the regulators (the rectification regulator RECTREG and the NMOS transistor MNrg in the rectification regulator driver RCTRGDRV) have current driving forces capable of controlling the voltage (vccrf) to satisfy Vccrf=2.7 V when maximum power is inputted on the assumption of a normal control operation but, during a shunt operation, the voltage (vccrect) needs to be further reduced to a lower potential. Note that, as shown in FIG. 13, when shunt_drv_gate='H' is satisfied, in the rectifying circuit RECTC, the voltage (vccrect2) is also fixed to the 'L' level. When each of the voltages (vccrect and vccrect2) is fixed to the 'L' level, each of the diode bridges in the rectifying circuit RECTC of FIG. 13 limits the amplitudes of the signals (tp and tm) to a range of those of forward voltages (threshold voltages of the diode-coupled MOS transistors) therein.

<Detailed Configuration of Clock Extracting Section CLKEXT>

Figure 17:
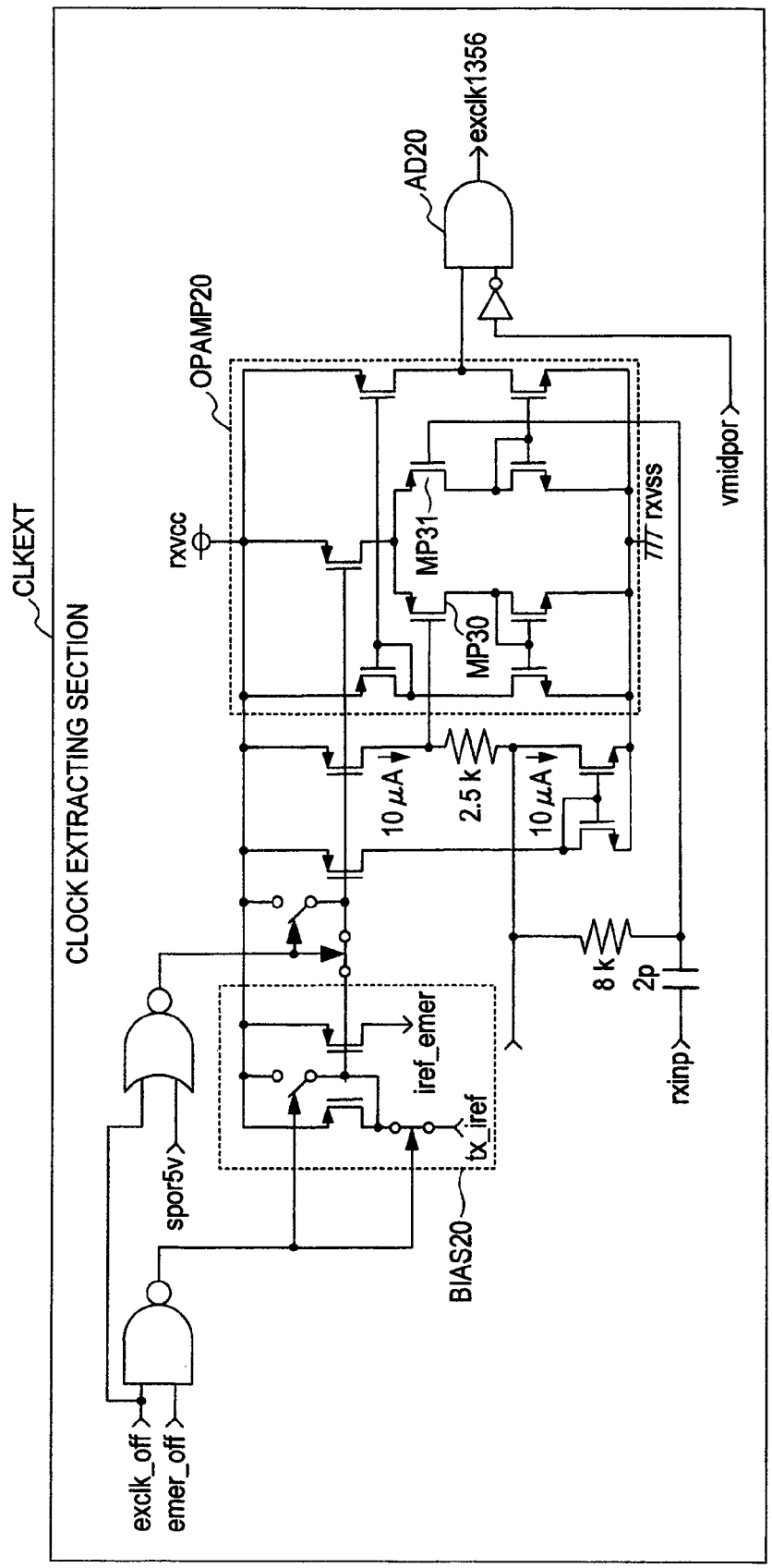
FIG. 17 is a circuit diagram showing, in the transmission block of FIG. 7, an example of a detailed configuration of a clock extracting section thereof.

FIG. 17 is a circuit diagram showing, in the transmission block TXBK of FIG. 7, an example of a detailed configuration of the clock extracting section CLKEXT thereof. The clock extracting section CLKEXT is a circuit which extracts a clock from each of reception signals (rxinp and rxinn) inputted to reception-side external terminals in FIG. 6. In addition, during a clock halt period, the clock extracting section CLKEXT outputs the 'L' level. Note that, in FIG. 17, preparatory elements are omitted.

The main body of the clock extracting section CLKEXT is a simple comparator using an operational amplifier circuit OPAMP20. The two inputs of the comparator (operational amplifier circuit OPAMP20) are received by PMOS transistors MP30 and MP31 so as to provide the clock extracting section CLKEXT with a configuration capable of receiving low-voltage inputs because rxvmid='L' is satisfied during the battery-less mode period. One of the two inputs of the comparator has a potential higher than that of the voltage (rxvmid) by 25 mV, which is generated from a 10 µA current generated by current-mirroring the reference current (tx_iref) from the reference generating circuit REFG of FIG. 6 and a 2.5 kΩ resistance. The other of the two inputs of the comparator is a signal obtained by removing a DC component from the signal (rxinp) using the voltage (rxvmid) as a reference.

The comparator compares the two inputs with each other and outputs the clock signal (exclk1356) via an AND circuit AD20. Note that, when the signal (rxinp) does not have an input amplitude, the 25 mV offset mentioned above is added such that the 'L' level is outputted as the clock signal (ex-clk1356). The reason that a current (iref_emer) is outputted by current-mirroring a current (tx_iref) is because the current (tx_iref) is used in each of the clock extracting section CLKEXT and the emergency detecting section EMERDET in the antenna driver section ADRV shown in FIG. 8. Therefore, a bias circuit BIAS20 which current-mirrors the current (tx_iref) is stopped only when exclk_off='H' and emer_off='H' are satisfied. When the control signal (spor5v) is disabled, the comparator is activated and, when the signal (vmidpor) is disabled, the clock is outputted.

<Detailed Configuration of Carrier Detecting Section TXCDET>

Figure 18A:
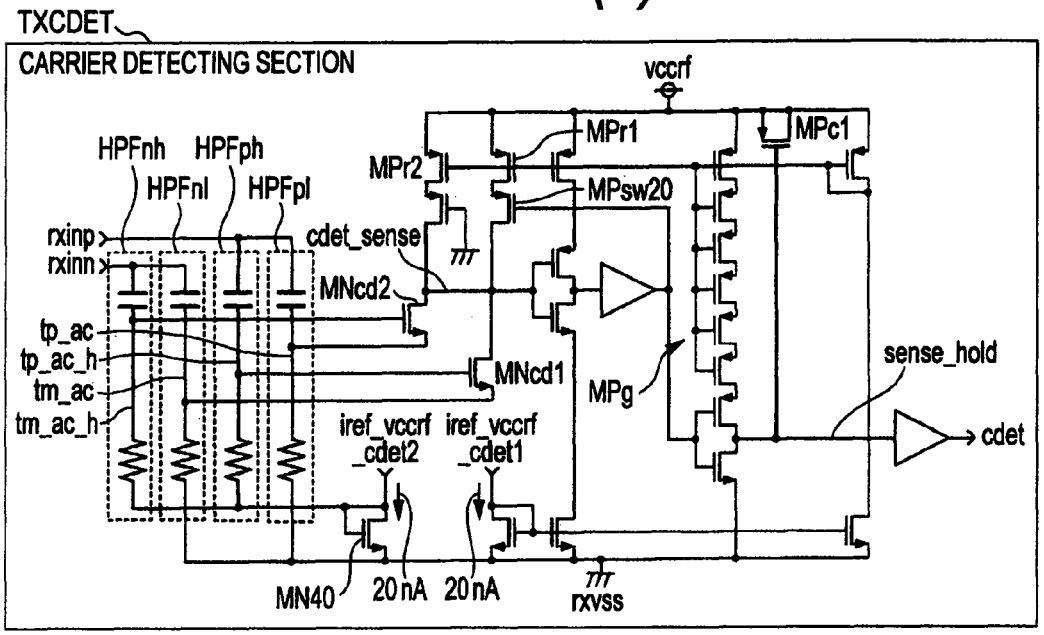
Figure 18B:
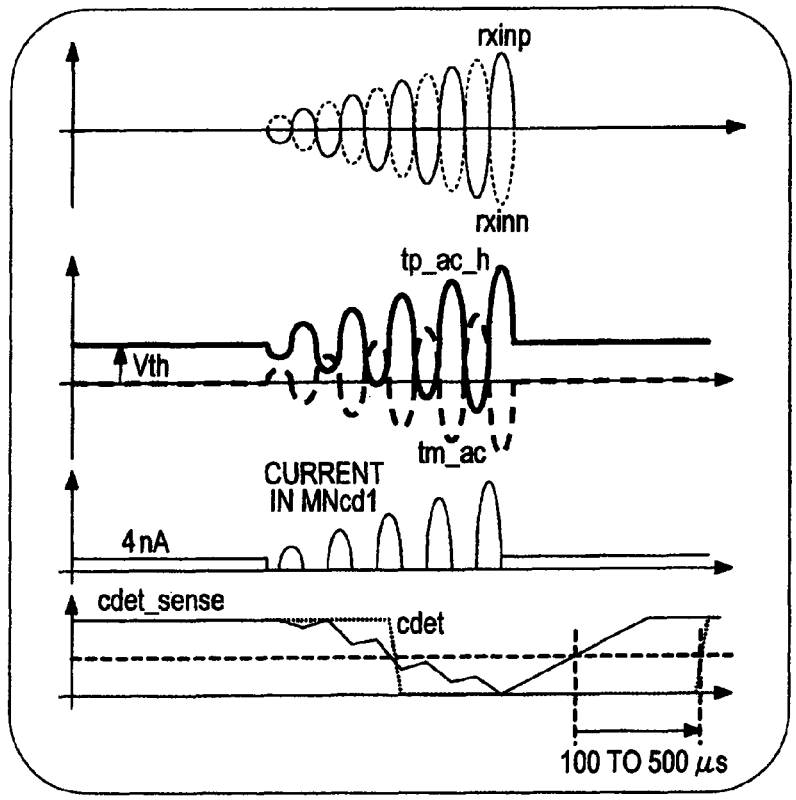

FIGS. 18(*a*) and 18(*b*) show a detail of the carrier detecting section TXCDET in the transmission block TXBK of FIG. 7, of which FIG. 18(*a*) is a circuit diagram showing an example of a configuration thereof and FIG. 18(*b*) is a waveform chart showing an example of operation in FIG. 18(*a*). The carrier detecting section TXCDET detects amplitudes occurring at the reception external terminals (of the reception signals (rxinp and rxinn)) during the RFS mode period. The detected signals are retained for 100 to 500 μs. Even during another mode period, carrier detection is not stopped. In FIG. 18(*a*), a reference current (iref_vccrf_cdet2) of, e.g., 20 nA is first inputted from the internal current supply IREG of FIG. 7 to bias a diode-coupled NMOS transistor MN40 to be biased. Since the flowing current is small in amount, the gate-source voltage Vgs of the NMOS transistor MN40 is substantially the threshold Vth.

The reception signals (rxinp and rxinn) are inputted to two types of respective high-pass filters. First-type high-pass filters HPFpl and HPFnl have DC levels each set to a ground power supply voltage (rxvss) level. Second-type high-pass filters HPFph and HPFnh have DC levels each set to a Vth level. To the high-pass filters HPFpl and HPFnl, the reception signals (rxinp and rxinn) are respectively inputted and, to the high-pass filters HPFph and HPFnh also, the reception signals (rxinp and rxinn) are respectively inputted. Here, when an AC signal has not been inputted to either of the reception signals (rxinp and rxinn) (the DC level does not matter), signals (tp_ac_h and tm_ac_h) serving as output signals from the high-pass filters HPFph and HPFnh are on the Vth level, while signals (tp_ac and tm_ac) serving as output signals from the high-pass filters HPFpl and HPFnl are on the 0 V level.

A detection NMOS transistor MNcd1 has the source thereof coupled to the signal (tm_ac) and the gate thereof coupled to the signal (tp_ac_h), while a detection signal NMOS transistor MNcd2 has the source thereof coupled to the signal (tp_ac) and the gate thereof coupled to the signal (tm_ac_h). Accordingly, when an AC signal has not been inputted, the gate-source voltages of the NMOS transistors MNcd1 and MNcd2 are substantially biased to the threshold Vth. It may be said that, in this state, the MOS transistor MN40 to be biased and the detection MOS transistors MNcd1 and MNcd2 are in a current mirror configuration, and a current corresponding to a mirror ratio flows to each of the detection MOS transistors MNcd1 and MNcd2 (set to about 4 nA). Note that a low-current current mirror has a large error but, since a state where a current scarcely flows is merely set in the circuit, a current mirror error does not present a problem.

Here, when AC signals are inputted to the reception signals (rxinp and rxinn), the AC signals are transmitted to the sources and gates of the detection MOS transistors MNcd1 and MNcd2. Here, since the gates and sources of the MOS transistors MNcd1 and MNcd2 are coupled such that the AC signals in opposite phases are transmitted thereto, there is a moment where Vgs>Vth is satisfied in each of the MOS transistors MNcd and MNcd2. When a Vgs>Vth state is established, currents flow from the MOS transistors MNcd1 and MNcd2 and a comparison is made between the current driving forces of current comparison PMOS transistors MPr1 and MPr2 via a signal (cdet_sense). As the amplitudes of the signals (rxinp and rxinn) increase, currents flowing in the detection MOS transistors MNcd1 and MNcd2 increase and, when the increased currents exceed the current values of the current comparison PMOS transistors MPr1 and MPr2, the detection signal (cdet) shifts from the 'H' level to the 'L' level via each of the subsequent-stage circuits, and the input of a carrier is detected.

When a carrier is not detected, by driving a PMOS transistor MPsw20 coupled in series to the current comparison PMOS transistor MPr1 into the ON state, each of the MOS transistors MPr1 and MPr2 is enabled so that a larger current becomes a threshold. That is, settings have been made to detect a larger amplitude. On the other hand, when a carrier is detected, only the PMOS transistor MPr2 is enabled, and settings have been made to detect a smaller amplitude. By switching between the current comparison PMOS transistors MPr1 and MPr2, a carrier detection amplitude is provided with a hysteresis. A node (sense_hold) having a plurality of PMOS transistors MPg coupled in series to a pull-up side of an output stage thereof has been set to exert a large driving force for a shift from the 'H' level to the 'L' level and a small driving force for a shift from the 'L' level to the 'H' level. By the functions of the node (sense_hold) and a MOS capacitor (MPc1) coupled thereto, the detection signal (cdet) is configured to momentarily shift from the 'H' level to the 'L' level, but hold the 'L' level for about 100 to 500 μs in a shift from the 'L' level to the 'H' level.

<Detailed Configuration of Internal Current Supply IREG>

Figure 19:
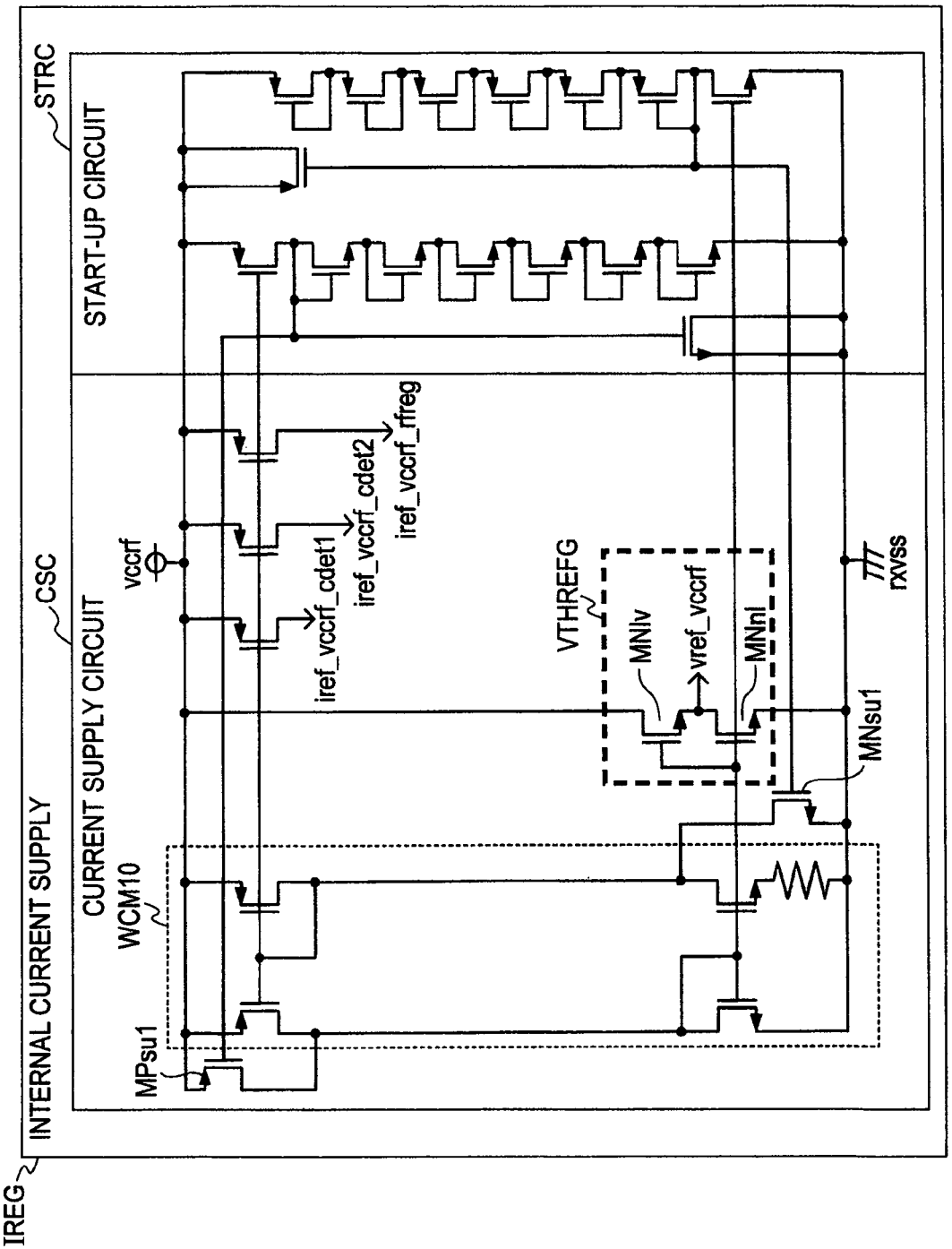
FIG. 19 is a circuit diagram showing, in the transmission block of FIG. 7, an example of a detailed configuration of an internal current supply thereof.

FIG. 19 is a circuit diagram showing, in the transmission block TXBK of FIG. 7, an example of a detailed configuration of the internal current supply IREG thereof. The internal current supply IREG is a circuit which supplies a current to each of the rectification regulator RECTREG and the carrier detecting section TXCDET. The internal current supply IREG also outputs a (low-accuracy) reference voltage using a difference between the thresholds Vth of MOS transistors for the rising time of the rectified power supply. As shown in FIG. 19, a current supply circuit CSC serving as the main body of the internal current supply IREG generates various reference currents (iref_vccrf_cdet1, iref_vccrf_cdet2, and iref_vccrf_rfreg) using a fundamental Widlar current mirror circuit WCM10. Here, at the time of activation, a start-up circuit STRC turns ON MOS transistors MPsu1 and MNsu1 added to the Widlar current mirror circuit WCM10 to thereby prevent high-speed activation and a current supply halt. A reference potential generating circuit VTHREFG allows the same current to flow to an NMOS transistor MN1*v* having low threshold voltage specifications and an NMOS transistor MNn1 having standard threshold voltage specifications and outputs a difference between the thresholds Vth thereof as the reference voltage (vref_vccrf).

<Detailed Configuration of Power Supply Controller VCTL (Main Portion)>

Figure 20:
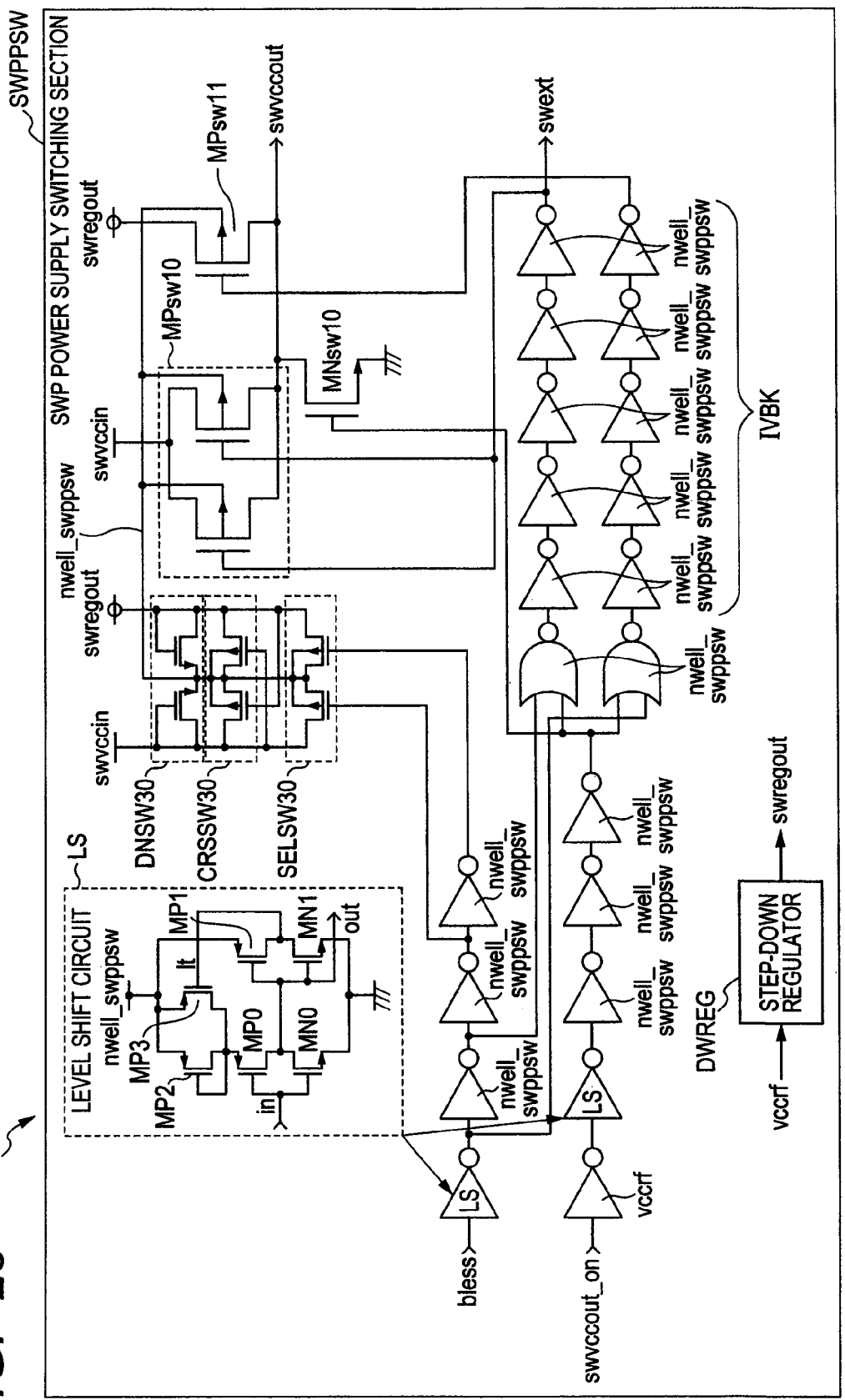
FIG. 20 is a circuit diagram showing an example of a detailed configuration of a main portion of a power supply controller of FIG. 6.

FIG. 20 is a circuit diagram showing an example of a detailed configuration of a main portion of the power supply controller VCTL of FIG. 6. As shown in FIG. 20, the power supply controller VCTL includes a SWP power supply switching section SWPPSW. As described with reference to FIGS. 5 and 6, the SWP power supply switching section SWPPSW is a circuit for supplying the proper power supply voltage (swvccout) to the UIM chip. As described above, to cause the NFC chip to operate on a mobile phone system, communication with the UIM chip UIM is needed for security. Here, in implementing a battery-less operation, a power supply to the UIM chip UIM during the battery-less operation presents a problem. When power is supplied directly to the power supply terminal of the UIM chip UIM, power may reversely flow to the battery through the regulator. There may be used a method which prevents the reverse flow using an external switch, but there is a demand to avoid difficulty in control without power and increased complexity of the mobile phone system. To prevent these, it is necessary to embed a power supply switch in the NFC chip and switch between a power supply from the mobile phone system and a rectified power supply during the battery-less mode period. At that time, the bulk voltage of the power supply switch presents a problem.

FIG. 21 is a supplementary view of FIG. 20 and shows a state of the SWP power supply voltage (swvccout) expected for inputted power supplies and signals. In FIGS. 20 and 21, swvccin is a SWP power supply given from the mobile phone system, swvccout is a SWP power supply given to the UIM chip, and swregout is a SWP power supply generated based on the power supply voltage (vccrf) generated in the rectifying section RECT of FIG. 13. That is, as shown in FIG. 20, a step-down regulator circuit DWREG lowers the power supply voltage (vccrf) (=2.7 V or the like) to generate the SWP power supply (swregout) of 1.8 V or the like. Here, the NFC chip of the present embodiment corresponds to a plurality of operation modes based on SWP standards and operations in the individual modes are as follows.

First, in a "Class B" mode, 3.0 V is inputted to the SWP power supply (swvccin), and the SWP power supply (swvccin) is outputted to the SWP power supply (swvccout). In a "Class C" mode, 1.8 V is inputted to the SWP power supply (swvccin), and the SWP power supply (swvccin) is outputted to the SWP power supply (swvccout). In a battery-less mode (BLESS), no power is supplied to the SWP power supply (swvccin) (0 V), and the SWP power supply (swregout) is outputted to the SWP power supply (swvccout). In a "Power Off" mode, no power supply is given to the power supply voltage (vccrf) and to the SWP power supply (swregout) (0 V), and the SWP power supply (swvccin) is outputted to the SWP power supply (swvccout).

To satisfy these specifications, the SWP power supply switching section SWPPSW includes a PMOS transistor MPsw11 for coupling the SWP power supply (swvccout) to the SWP power supply (swregout), a PMOS transistor MPsw10 for coupling the SWP power supply (swvccout) to the SWP power supply (swvccin), and an NMOS transistor MNsw10 for coupling the SWP power supply (swvccout) to the ground power supply voltage. The turning ON/OFF of each of the transistors is controlled appropriately in accordance with the detection signal (bless) from the rectifying section RECT of FIG. 13 and the signal (swvccout_on) from the microprocessor MPU of FIG. 6. Note that, as shown in FIG. 21, the voltage value of the SWP power supply (swvccin) is not less than that of the SWP power supply (swregout) so that the PMOS transistor MPsw10 has a driving ability higher than that of the PMOS transistor MPsw11. Also, the PMOS transistors MPsw10 and MPsw11 that are power supply switches have relatively large sizes and, for the driving thereof, a multi-stage inverter circuit IVBK is provided.

In such power supply switches (MPsw10 and MPSw11), in the same manner as for the pull-up PMOS transistors in the antenna driver section ADRV described above, bulk voltages (nwell_swppsw) thereof need to be properly controlled. For example, when the bulk voltage of the power supply switch MPsw10 is coupled to the SWP power supply (swvccin), since swvccin=0 V is satisfied during the battery-less mode period, power leakage from the SWP power supply (swvccout) to the SWP power supply (swvccin) occurs. Also, for example, when the bulk voltage of the power supply switch MPsw11 is coupled to the SWP power supply (swregout), power leakage occurs when the SWP power supply (swvccout) outputs the SWP power supply (swvccin). Accordingly, an NMOS diode switch circuit DNSW30, a cross switch circuit CRSSW30, and a selection switch circuit SELSW30 are provided here. Each of the switch circuits has the same configuration as that described with respect to the power supply switching section PSWBK of FIG. 13 or the like. Basically, the higher-potential one of the SWP power supplies (swvccin and swregout) is supplied to the bulk voltage (nwell_swppsw). Otherwise, in the battery-less mode, the SWP power supply (swregout) is supplied thereto and, in other modes, the SWP power supply (swvccin) is supplied thereto.

When the signal (swvccout_on) is on the 'L' level, the power supply toward the UIM chip UIM is cut off and, in this case, the NMOS transistor MNsw10 is turned ON and each of the PMOS transistors MPsw10 and MPsw11 is turned OFF. On the other hand, when the signal (swvccout_on) is on the 'H' level, the power supply toward the UIM chip UIM is performed so that the NMOS transistor MNsw10 is turned OFF and either of the PMOS transistors MPsw10 and MPsw11 is turned ON depending on the level of the detection signal (bless). At this time, according to its specifications, the NMOS transistor MNsw10 used for the SWP power supply (swvccin) is turned ON when the control signal (swext) is on the 'L' level. The signal (swext) is outputted to the outside of the NFC chip and, as shown in, e.g., FIG. 22, used to drive an external switch OSW coupled in parallel to the PMOS transistor MPsw10 outside the NFC chip.

Figure 22:
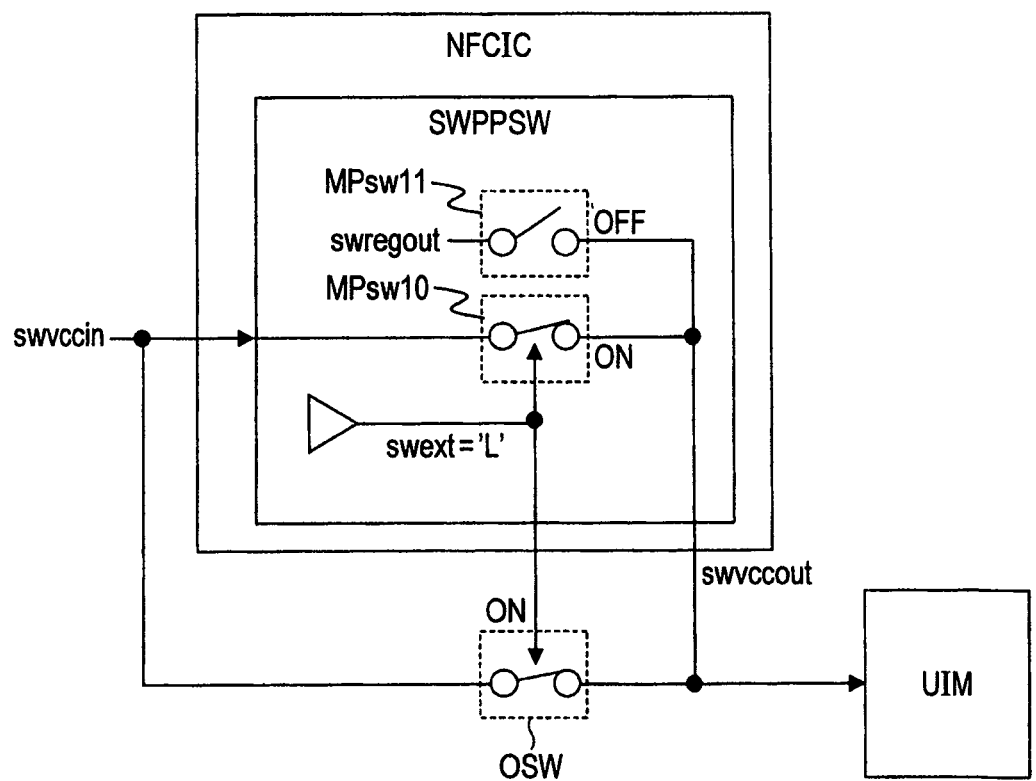
FIG. 22 is another supplementary view of FIG. 20.

In the NFC chip, during the battery-less mode period, a power supply obtained by lowering power generated from the rectified power with the regulator needs to be given to the UIM chip UIM. Accordingly, the NFC chip is configured to give the power supply that has passed through the NFC chip once to the UIM chip UIM even in an operation mode other than the battery-less mode. However, since a switch inside the NFC chip has a relatively high resistance, the switch resistance can be reduced using the external switch OSW. As shown in FIG. 22, the external switch OSW needs to perform the same operation as that of the PMOS transistor MPsw10. Therefore, in the configuration of the external switch OSW, it is desirable to use a PMOS transistor. In addition, since the power supply from the SWP power supply (swvccin) is stopped in the battery-less mode, the power supply reversely flows in a simple PMOS switch. Therefore, it is necessary to provide a PMOS transistor as shown in FIG. 24 with a 2-stage configuration and prevent a reverse current flow from the bulk.

The following is the summary of the main characteristic features of the NFC chip of the present embodiment described above.

(1) In the NFC chip of the present embodiment, in order to use one terminal as each of the antenna driving terminal and the rectified power input terminal, the bulk voltage of each of the antenna driving PMOS transistors is coupled to a high voltage during the rectifying operation. The high voltage is generated using the 2-stage rectifying circuit (or Dickson-type charge pump circuit). That is, if one terminal is simply used as each of the antenna driving terminal and the rectified power input terminal, the rectified power may flow out to the ground power supply voltage through the parasitic PNP bipolar transistor of the antenna driving PMOS transistor. Accordingly, the bulk voltage of the PMOS transistor is coupled to the 2-stage boosted voltage to bring the parasitic PNP transistor into the OFF state and eliminate outflow of the rectified power.

(2) Likewise, when a triple well process is used for each of the antenna driving NMOS transistors, a "deep nwell" layer is coupled to the ground power supply voltage. That is, when the triple well process is used for the NMOS transistor, a current may flow from the power supply to the antenna driving terminal through the parasitic NPN bipolar transistor. Accordingly, by setting the potential of the "deep nwell" layer to that of the ground power supply voltage, there is no outflow of a current from the power supply.

(3) The characteristic features (1) and (2) described above allow one terminal to be used as each of the antenna driving terminal and the rectified power input terminal. That is, since each of the antenna driving terminal and the rectified power input terminal is a terminal which allows high power to flow, if they are placed in parallel, area and cost increase may occur to additionally cause power leakage. Therefore, by using one terminal as each of the antenna driving terminal and the rectified power input terminal, it is possible to reduce area and cost and prevent power leakage.

(4) In the NFC chip of the present embodiment, in order not to interrupt the rectifying operation, the feedback CR circuit for reducing harmonic that is feedback-coupled from the antenna driving terminal to the gate of each of the antenna driving MOS transistors is cut off during the rectifying operation. That is, during the rectifying operation, the feedback CR circuit drives the gate of each of the antenna driving MOS transistors, though only slightly, and the input power from the antenna leaks from the antenna driving MOS transistor, which may degrade rectification efficiency. Therefore, by cutting off the feedback CR circuit, the gate voltage of each of the antenna driving MOS transistors no longer moves and prevents the rectifying operation from being inhibited.

(5) In the NFC chip of the present embodiment, in order to switch the bulk voltage of each of the PMOS transistors, the power supply switching section including the switch is provided. The switch of the power supply switching section has challenges such as preventing a reverse flow even in a power exhausted state, occupying a minimized area, reliably operating even in a low-voltage state at the starting time of the rectifying operation. Therefore, in the power supply switching section, the bulk voltage of the PMOS transistor is switched to, e.g., either the external power supply (mvdd) or the rectified power supply (vccrect) to prevent the reverse flow of the current via the PMOS transistor irrespective of the ON/OFF state of the external power supply (mvdd). For example, there is no need to provide the PMOS transistor with a 2-stage configuration as shown in FIG. 24, and an area reduction can be achieved.

As the switch of the power supply switching section, e.g., a diode-coupled NMOS switch is used to allow the output power supply voltage (vccrf) to reliably rise even when the signal (bless) showing whether or not a battery-less operation is performed during a low-voltage period has not been determined. When the voltage (vccrf) has risen to a certain level and the signal (bless) has been determined, by using the PMOS switch as a main switch and controlling the PMOS switch with the signal (bless), it is possible to couple the power supply by a reliable operation. When the PMOS switch is used, it is useful to additionally use a cross-coupled PMOS switch. The cross-coupled PMOS switch can output the higher one of the two types of power supply voltages. As a result, even when the signal (bless) has not been determined during the low-voltage period, it is possible to reliably raise the output power supply voltage.

(6) In the NFC chip of the present embodiment, the ASK modulation percent is controlled by the antenna driving pull-up PMOS transistors, the antenna driving pull-down NMOS transistors, and the modulation percent correcting pull-down PMOS transistors and, using register settings in the microprocessor MPU or the like, optimum settings can be selected for the configuration of the external antenna or the like. For example, when, e.g., an ASK amplitude is intended to decrease to 80%, it is not sufficient to simply reduce the current driving force of each of the antenna driving MOS transistors to 80%. The antenna current driving force and the ASK amplitude have a non-linear relationship therebetween, and the relationship varies from one antenna to another. Moreover, when the current driving force of the MOS transistor has been changed by the PVT variations, even when the change in current driving force is the same, the ASK modulation percent changes undesirably.

Therefore, by allowing the pull-up PMOS transistors/pull-down NMOS transistors to be set with a register for the control of the ASK modulation percent, it is possible to set an optimum change in current driving force associated with the ASK modulation irrespective of the type of the antenna and obtain a stable ASK modulation percent. Also, by turning ON the modulation percent correcting pull-down PMOS transistors, the ASK amplitude can be reduced. That is, by reducing the number of the pull-up PMOS transistors/pull-down NMOS transistors to be turned ON, the ASK amplitude is reduced. Accordingly, when the current driving force of each of the MOS transistors varies due to the PVT variations, the ASK modulation percent varies in opposite directions in the pull-up PMOS transistors/pull-down NMOS transistors and in the modulation percent correcting pull-down PMOS transistors. Therefore, by appropriately using the modulation percent correcting pull-down PMOS transistors, it is possible to obtain a stable ASK modulation percent despite the PVT variations. However, since the effect of the modulation percent correcting pull-down PMOS transistors also differs from one antenna to another, settings with a register are allowed to be made.

(7) The NFC chip of the present embodiment is configured such that the chip recognizes that the battery-less operation is performed from a battery-less mode determination signal and the entire chip shifts to a low power consumption operation mode to be capable of elongating a communication distance in the battery-less mode. That is, since the NFC chip obtains power from the mobile phone system, compared with a typical NFC-compatible IC card (which operates only with antenna power), the NFC chip can operate with higher power. However, on the contrary, when the NFC chip operates in the battery-less mode, high power is required so that the communication distance thereof is extremely shortened compared with that of the IC card. Accordingly, it is desired to sense the battery-less operation and cause a shift to the low power consumption mode but, if the NFC chip is configured to, e.g., directly supply rectified power to the external power supply, it becomes difficult for the NFC chip to sense the battery-less mode. Therefore, by cutting off the external power supply from the rectified power supply, the NFC chip can sense its operation in the battery-less mode (in the battery-less mode when the external power supply has lowered). This allows the entire NFC chip to operate in the low power consumption mode and elongate the communication distance, though it is not so long as the communication distance of the IC card.

(8) The NFC chip of the present embodiment includes the carrier detecting section which detects a carrier inputted from the outside. The carrier detecting section is configured to be able to obtain stable carrier sensitivity by correcting the thresholds Vth of the MOS transistors using the high-pass filters irrespective of variations in the thresholds Vth of the MOS transistors. The carrier detecting section operates even when the NFC chip is in the RF sensor mode. The RF sensor mode is a mode which monitors the presence or absence of a signal input from the antenna and, at this time, the entire NFC chip except for the carrier detecting section is in a standby state (power cut-off state). Accordingly, the power consumption of the carrier detecting section is associated with the battery standby time of the mobile phone. This results in the problem that it is difficult to use a complicated circuit and the threshold of carrier detection largely varies due to variations in threshold Vth, temperature variations, or the like. Therefore, by correcting the threshold Vth of the MOS transistor using the high-pass filter, it is possible to monitor the carrier amplitude irrespective of a change in threshold Vt and therefore implement a circuit configuration which is relatively resistant to the PVT variations.

(9) The NFC chip of the present embodiment includes the SWP power supply switching section, and the SWP power supply switching section is configured to appropriately switch the bulk voltage of each of the MOS switches. In general, the power supply switch cannot recognize whether the input-side and output-side power supplies thereof are ON or OFF. When a switch having, e.g., a 1-stage configuration of a PMOS transistor is used as the power supply switch, a current reversely flows through the bulk. To prevent this, a configuration example as shown in FIG. 24 described above can be used, but undesirably increases an area. In particular, since a large current flow and a low voltage drop are required of the power supply switch, it results in an extremely large switch. Accordingly, by appropriately switching the bulk voltage of the MOS switch, it is possible to prevent a reverse current flow through the bulk. As a result, the switch having the 1-stage configuration of the PMOS transistor can be used, and therefore the area can be reduced.

(10) The NFC chip of the present embodiment includes the SWP power supply switching section and, in the SWP power supply switching section, the control signal for switching between the supply of power from the mobile phone system to the UIM chip and the cur-off thereof shows the cut-off when it is on the 'L' level. If the control signal for switching between the supply of power from the mobile phone system to the UIM chip and the cut-off thereof is set to show the cut-off when it is on the 'H' level, when the mobile phone system is activated, it is undesirably activated with the power being supplied to the UIM chip. Therefore, by setting the control signal for switching between the supply of power from the mobile phone system to the UIM chip and the cut-off thereof such that the control signal shows the cut-off when it is on the 'L' level, the power is not supplied to the UIM chip when the mobile phone system is activated and the sequence of system activation can be correctly controlled.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The semiconductor device for wireless communication according to the present embodiment is particularly useful when applied to a product having each of a reader/writer function and an IC card function but, needless to say, it is not limited thereto. For example, the semiconductor device for wireless communication is similarly applicable to various general semiconductor devices for wireless communication such as a product having each of a reader/writer function and a tag function in RFID (Radio Frequency IDentification).

What is claimed is:

1. A semiconductor device for wireless communication, comprising:
    a first terminal serving as an antenna coupling terminal to couple with an antenna and input with an alternating current signal via the antenna;
    a p-channel first MISFET having a source-drain path coupled between the first terminal and a first power supply voltage terminal to drive the antenna;
    an n-channel second MISFET having a source-drain path coupled between the first terminal and a second power supply voltage terminal to drive the antenna; and
    a rectifying circuit section coupled to the first terminal and the p-channel first MISFET,
    wherein the rectifying circuit section includes:
        a first rectifying circuit which receives the alternating current signal input thereto to perform a rectifying operation via a first element having a diode function;
        a first capacitor coupled between an output node of the first rectifying circuit and a ground power supply voltage;
        a second capacitor having a first terminal to which the alternating current signal is input;
        a second rectifying circuit which receives a signal from a second terminal of the second capacitor input thereto to perform a rectifying operation via a second element having a diode function; and
        a third capacitor coupled between an output node of the second rectifying circuit and the output node of the first rectifying circuit,
    wherein the rectifying circuit section uses the alternating current signal input to the first terminal via the antenna to generate a third power supply voltage having a value higher than that of a first power supply voltage at the first power supply voltage terminal and higher than a voltage occurring at the first terminal when the alternating current signal has a maximum amplitude,
    wherein the third power supply voltage is applied as a bulk voltage of the first MISFET,
    wherein the third power supply voltage is generated from the output node of the second rectifying circuit, and
    wherein a fourth power supply voltage is generated from the output node of the first rectifying circuit.

2. The semiconductor device for wireless communication according to claim 1,
    wherein the first MISFET includes:
    a p-type first semiconductor layer; and
    an n-type second semiconductor layer which is formed in the first semiconductor layer and in which a channel of the first MISFET is formed, and
    wherein the first semiconductor layer is supplied with a voltage level at the same potential as that of a second power supply voltage at the second power supply voltage terminal.

3. The semiconductor device for wireless communication according to claim 1,
    wherein the second MISFET includes:
    a p-type third semiconductor layer;
    an n-type fourth semiconductor layer formed in the third semiconductor layer; and a p-type fifth semiconductor layer which is formed in the fourth semiconductor layer and in which a channel of the second MISFET is formed, and wherein the fourth semiconductor layer is supplied with a voltage level at the same potential as that of the second power supply voltage.

4. The semiconductor device for wireless communication according to claim 1, wherein the third power supply voltage is used also as a gate voltage when the first MISFET is driven to be turned OFF.

5. The semiconductor device for wireless communication according to claim 1, further comprising:

a first switch circuit which selectively supplies either the third power supply voltage or the first power supply voltage as the bulk voltage of the first MISFET.

6. The semiconductor device for wireless communication according to claim 5, further comprising:

a determining circuit which operates using the power supply voltage generated by the rectifying circuit section to determine a magnitude of the external power supply, wherein the first switch circuit has:

a p-channel third MISFET having one of source/drain regions thereof coupled to the first power supply voltage and the other thereof coupled to the bulk voltage of the first MISFET such that an ON/OFF state thereof is controlled depending on a result of the determination by the determining circuit; and a p-channel fourth MISFET having one of source/drain regions thereof coupled to the third power supply voltage and the other thereof coupled to the bulk voltage of the first MISFET such that an ON/OFF state thereof is controlled complementarily to the third MISFET depending on the result of the determination by the determining circuit.

7. The semiconductor device for wireless communication according to claim 6, wherein the first switch circuit further has:

a p-channel fifth MISFET having one of source/drain regions thereof coupled to the first power supply voltage, the other thereof coupled to the bulk voltage of the first MISFET, and a gate electrode thereof coupled to the third power supply voltage; and a p-channel sixth MISFET having one of source/drain regions thereof coupled to the third power supply voltage, the other thereof coupled to the bulk voltage of the first MISFET, and a gate electrode thereof coupled to the first power supply voltage.

8. The semiconductor device for wireless communication according to claim 1, wherein, as the other of the external power supplies, each of a higher-potential fifth power supply voltage and a lower-potential sixth power supply voltage is further supplied, the semiconductor device for wireless communication further comprising:

a second switch circuit which selectively supplies either the fourth power supply voltage or the fifth power supply voltage as an internal power supply voltage.

9. The semiconductor device for wireless communication according to claim 8, further comprising:

a regulator circuit which controls a magnitude of the fourth power supply voltage, wherein the regulator circuit has:

a seventh MISFET having a source-drain path coupled between the fourth power supply voltage and the ground power supply voltage; and an amplifier circuit which detects the internal power supply voltage coupled to the fourth power supply voltage via the second switch circuit, compares the internal power supply voltage with a preset reference voltage, and drives a gate electrode of the seventh MISFET according to a result of the comparison.

10. The semiconductor device for wireless communication according to claim 1, further comprising:

a second terminal which serves as a terminal for receiving a modulation signal input from the antenna;

a demodulating circuit for demodulating the modulation signal; and a shunt switch for short-circuiting the output nodes of the first and second rectifying circuits to the ground power supply voltage.

11. A semiconductor device for wireless communication comprising:

a first terminal serving as an antenna coupling terminal to couple with an antenna and input with an alternating current signal via the antenna;

a p-channel first MISFET having a source-drain path coupled between the first terminal and a first power supply voltage terminal to drive the antenna;

an n-channel second MISFET having a source-drain path coupled between the first terminal and a second power supply voltage terminal to drive the antenna;

a rectifying circuit section coupled to the first terminal and the p-channel first MISFET;

a first feedback path provided between the first terminal and a gate electrode of the first MISFET to retard a shift of a gate voltage of the first MISFET using a resistive component and a capacitive component; and a second feedback path provided between the first terminal and a gate electrode of the second MISFET to retard a shift of a gate voltage of the second MISFET using a resistive component and a capacitive component, wherein the rectifying circuit uses the alternating current signal input to the first terminal via the antenna to generate a third power supply voltage having a value higher than that of a first power supply voltage at the first power supply voltage terminal and higher than a voltage occurring at the first terminal when the alternating current signal has a maximum amplitude, wherein the third power supply voltage is applied as a bulk voltage of the first MISFET, wherein the first feedback path includes a first coupling switch for controlling conduction/non-conduction between the first terminal and the gate electrode of the first MISFET, and wherein the second feedback path includes a second coupling switch for controlling conduction/non-conduction between the first terminal and the gate electrode of the second MISFET.

12. The semiconductor device for wireless communication according to claim 1, wherein the first MISFET includes a plurality of MISFETs coupled in parallel to each other, wherein the second MISFET includes a plurality of MISFETs coupled in parallel to each other, wherein, when turning ON the first MISFET, the semiconductor device for wireless communication selects the MISFET to be actually turned ON from among the MISFETs included in the first MISFET, and wherein, when turning ON the second MISFET, the semiconductor device for wireless communication selects the MISFET to be actually turned ON from among the MISFETs included in the second MISFET.

13. The semiconductor device for wireless communication according to claim 12, further comprising:
- a p-channel eighth MISFET having a source-drain path coupled between the first terminal and the second power supply voltage to drive the antenna,
- wherein the eighth MISFET includes a plurality of MISFETs coupled in parallel to each other, and
- wherein, when turning ON the eighth MISFET, the semiconductor device for wireless communication selects the MISFET to be actually turned ON from among the MISFETs included in the eighth MISFET.

14. A semiconductor device for wireless communication, comprising:
- a first terminal to which an alternating current signal input via an antenna is transmitted;
- a rectifying circuit section coupled to the first terminal to rectify the alternating current signal and thereby generate a second power supply voltage;
- a regulator circuit which generates a third power supply voltage having a predetermined value from the second power supply voltage;
- a second terminal serving as a terminal for supplying a direct current voltage to an external circuit;
- a p-channel first MISFET having a source-drain path coupled between a first power supply voltage terminal and the second terminal;
- a p-channel second MISFET having a source-drain path coupled between the third power supply voltage and the second terminal; and
- a switch circuit which selects a first power supply voltage from the first power supply voltage terminal in a first mode or selects the third power supply voltage in a second mode and outputs the selected power supply voltage as a fourth power supply voltage,
- wherein the fourth power supply voltage is supplied to a bulk of each of the first MISFET and second MISFET, and
- wherein when the third power supply voltage is selected, the third power supply voltage is higher than the first power supply voltage and higher than the second power supply voltage.

15. The semiconductor device for wireless communication according to claim 14, further comprising:
- a determining circuit which operates using the second power supply voltage generated by the rectifying circuit section to determine a magnitude of the external power supply,
- wherein the switch circuit has;
- a p-channel third MISFET having one of source/drain regions thereof coupled to the first power supply voltage and the other thereof coupled to the fourth power supply voltage such that an ON/OFF state thereof is controlled depending on a result of the determination by the determining circuit; and
- a p-channel fourth MISFET having one of source/drain regions thereof coupled to the third power supply voltage and the other thereof coupled to the fourth power supply voltage such that an ON/OFF state thereof is controlled complementarily to the third MISFET depending on the result of the determination by the determining circuit.

16. The semiconductor device for wireless communication according to claim 15,
- wherein the switch circuit further has:
- a p-channel fifth MISFET having one of source/drain regions thereof coupled to the first power supply voltage, the other thereof coupled to the fourth power supply voltage, and a gate electrode thereof coupled to the third power supply voltage; and
- a p-channel sixth MISFET having one of source/drain regions thereof coupled to the third power supply voltage, the other thereof coupled to the fourth power supply voltage, and a gate electrode thereof coupled to the first power supply voltage.

17. The semiconductor device for wireless communication according to claim 15,
- wherein the switch circuit further has:
- an n-channel seventh MISFET having a drain region and a gate electrode thereof each coupled to the first power supply voltage and a source region thereof coupled to the fourth power supply voltage; and
- an n-channel eighth MISFET having a drain region and a gate electrode thereof each coupled to the third power supply voltage and a source region thereof coupled to the fourth power supply voltage.

* * * * *